United States Patent [19]
Trimberger et al.

[11] Patent Number: 5,513,124
[45] Date of Patent: Apr. 30, 1996

[54] LOGIC PLACEMENT USING POSITIONALLY ASYMMETRICAL PARTITIONING METHOD

[75] Inventors: Stephen M. Trimberger, San Jose; Mon-Ren Chene, Cupertino, both of Calif.

[73] Assignee: Xilinx, Inc., San Jose, Calif.

[21] Appl. No.: 30,517

[22] Filed: Mar. 12, 1993

Related U.S. Application Data

[63] Continuation-in-part of Ser. No. 784,844, Oct. 30, 1991, Pat. No. 5,224,056.

[51] Int. Cl.$^6$ .................................................. G06F 17/50
[52] U.S. Cl. .......................... 364/491; 364/490; 364/489
[58] Field of Search .................................. 364/488, 489, 364/490, 491

[56] References Cited

U.S. PATENT DOCUMENTS

| | | | |
|---|---|---|---|
| 3,617,714 | 11/1971 | Kernighan et al. | 364/488 |
| 4,706,216 | 11/1987 | Carter | 365/94 |
| 4,870,302 | 9/1989 | Freeman | 307/465 |
| 4,890,238 | 12/1989 | Klein et al. | 364/49 |
| 4,908,772 | 3/1990 | Chi | 364/491 |
| 4,967,367 | 10/1990 | Piednoir | 364/489 |
| 5,189,628 | 2/1993 | Olsen et al. | 364/489 |
| 5,224,056 | 6/1993 | Chene et al. | 364/490 |
| 5,341,308 | 8/1994 | Mendel | 364/489 |

OTHER PUBLICATIONS

Kirkpatrick, S.; Gelatt, C. D., Jr.; Vecchi, M. P., "Optimization by Simulated Annealing," Science, vol. 220, pp. 671–680, May 13, 1983.

Soukup, Jiri, "Circuit Layout," Proc.IEEE, vol. 69, pp. 1281–1304, Oct. 1981.

Fawcett, Bradley, "Double Density and Speed For Next Generation FPGAS," New Electronics, Mar. 1990, pp. 51–52.

Hartoog, Mark R., "Analysis of Placement Procedures for VLSI Standard Cell Layout," 23rd Design Automation Conference, Paper 16.4, pp. 314–319, 1986.

R. Shahookar & P. Mazumder, "VLSI Cell Placement Techniques", Dept. of Electrical Engineering & Computer Science, University of Michigan, Ann. Arbor, MI 48109, ACM Computing Surveys, vol. 23, pp. 143–220, No, 2, Jun. 1991.

Carl Sechen & Dahe Chen, "An Improved Objective Function for Mincut Circuit Partitioning", Dept. of Electrical Engineering, Yale University, New Haven CT 06520, 1988, IEEE.

Odawara, Gotaro; Hiraide, Takahisa; Nishina, Osamu, "Partitioning and Placement Technique for CMOS Gate Arrays" IEEE–Transactions on Computer Aided Design, vol. CAD–6, No. 3, May 1987, pp. 355–363.

(List continued on next page.)

*Primary Examiner*—Vincent N. Trans
*Attorney, Agent, or Firm*—Edel M. Young; Antohny C. Murabito

[57] ABSTRACT

A modified partitioning method for placement of a circuit design into a programmable integrated circuit device having a specific distribution of physical resources along a horizontal or vertical line in the device. The circuit design includes a plurality of circuit elements, for example three-state buffers which feed a common bus, or registers which receive a common clock signal. Such elements should or must be placed along a single horizontal or vertical line. One method includes the step of weighting connecting lines (nets) which join circuit elements to be placed along a common line with different weights for the horizontal and vertical directions. Alternatively, elements to be placed along the line are marked to be kept in line during partitioning. A min-cut algorithm then tends to or is required to avoid separating particular elements from a common line. The group containing the circuit elements with the line requirement is then partitioned such that the area and location of the group corresponds to the horizontal or vertical line.

10 Claims, 20 Drawing Sheets

OTHER PUBLICATIONS

Nakamura, Shuniohiro; Murai, Shinichi; Tanaka, Chiyoji, "LORES–Logic Reorganization System", IEEE 15th Design Automation Conference, 1978, pp. 250–260.

Francis, Robert J.; Rose, Jonathan; Chung, Kevin, "Chortle: A Technology Mapping Program for Lookup Table–Based Field Programmable Gate Arrays", 27th ACM/IEEE Design Automation conference, 1990, pp. 613–619.

Fiduccia, C. M.; Mattheyses, R. M., "A Linear–Time Heuristic for Improving Network Partitions", IEEE 19th Design Automation Conference, 1982, pp. 175–181.

Breuer, Melvin A., "A Class of Min–Cut Placement Algorithms", Dept. of Electrical Engineering and Computer Science, University of Southern California, pp. 284–290.

Breuer, Melvin A., "Min–Cut Placement", J. Design Automation and Fault Tolerant Computing, vol. 1, No. 4, pp. 343–362, Oct. 1977.

Kernighan, B. W.; Lin, S., "An Efficient Heuristic Procedure for Partitioning Graphs", The Bell System Technical Journal Feb. 1970, pp. 291–307.

LOGIC PLACEMENT USING POSITIONALLY ASYMMETRICAL PARTITIONING METHOD

CROSS-REFERENCE TO RELATED CO-PENDING APPLICATIONS

This application is a continuation-in-part of patent application Ser. No. 07/784,844 filed Oct. 30, 1991, now U.S. Pat. No. 5,224,056 and is related to the following co-pending patent applications, all assigned to the assignee of the present application and all incorporated herein by reference:

(a) Ser. No. 07/456,010, "Structure and Method for Manually Controlling Automatic Configuration in an Integrated Circuit Logic Block Array", filed Dec. 20, 1989, now U.S. Pat. No. 5,448,493.

(b) Ser. No. 07/387,566, "Distributed Memory Architecture for a Configurable Logic Array and Method for Using Distributed Memory", filed Jul. 28, 1989, now U.S. Pat. No. 5,343,406.

(c) Ser. No. 07/522,336, "Logic Structure and Circuit for Fast Carry", filed May 10, 1990, now abandoned.

(d) Ser. No. 07/613,189, "Logic Duplication Method For Reducing Circuit Size and Delay Time", filed via Express mail Nov. 12, 1990, now abandoned.

CROSS REFERENCE TO RELATED PATENT

The disclosures of the following U.S. patents are incorporated herein by reference:

(a) U.S. Pat. No. 4,870,302, "Configurable Electrical Circuit Having Configurable Logic Elements and Configurable Interconnects", issued to Ross H. Freeman, Sep. 26, 1989.

(b) U.S. Pat. No. 4,706,216, "Configurable Logic Element", issued to
William S. Carter, Nov. 10, 1987.

(c) U.S. Pat. No. 4,642,487, "Special Interconnect for Configurable Logic Array", issued to William S. Carter, Feb. 10, 1987.

(d) U.S. Pat. No. 4,695,740, "Bidirectional Buffer Amplifier", issued to William S. Carter, Sep. 22, 1987.

(e) U.S. Pat. No. 4,855,619, "Buffered Routing Element for a User Programmable Logic Device", issued to Hung-Cheng Hsieh and William S. Carter, Aug. 8, 1989.

(f) U.S. Pat. No. 4,835,418, "Three-State Bidirectional Buffer", issued to Hung-Cheng Hsieh, May 30, 1989.

(g) U.S. Pat. No. 3,617,714, "Method of Minimizing the Interconnection Cost of Linked Objects", issued to Kernighan & Lin, Nov. 2, 1971.

(h) U.S. Pat. No. 5,068,603, "Structure and Method for Producing Mask-Programmed Integrated Circuits Which are Pin Compatible Substitutes for Memory-Configured Logic Arrays", Inventor: John E. Mahoney, issued Nov. 26, 1991.

(i) U.S. Pat. No. 5,140,193, "Programmable Connector", Inventors: Ross H. Freeman et al., issued Aug. 18, 1992.

BACKGROUND

1. Field of the Invention

The present invention is generally directed to a method for partitioning and placing components of a circuit design into a programmable integrated circuit device which can be configured to implement the design.

The invention is more specifically directed to a modified placement by partitioning method used for initial or "rough" placement of a circuit design into a field-programmable gate array (FPGA).

2. Description of the Related Art

VLSI Design

Very Large Scale Integration (VLSI) design comprises the steps of circuit design, in which a schematic design resembling a desired circuit is created; and layout, in which an actual VLSI device is planned and produced to perform the function described in the schematic design. The VLSI device may be a custom circuit which is produced on a silicon substrate by wafer fabrication processes, or the VLSI device may be a circuit design which is incorporated into a programmable integrated circuit device (PICD) such as a field programmable gate array (FPGA).

The goal of the layout process is to efficiently construct a device which minimizes layout area and signal propagation delays between associated logic elements. The layout process is generally divided into two separate procedures: placement and routing.

Placement is the assignment of elements of a circuit design to specified areas of a VLSI circuit. The total required layout area and the signal propagation delays between connected elements are considered in the selection of locations for each element.

Routing is the formation of an interconnection network connecting associated elements of the circuit design.

In a simplified (small scale) device layout process, placement and routing processes are relatively simple and can be done manually by a skilled practitioner. However, VLSI design is typically far too complicated for a skilled practitioner to perform un-aided placement and routing efficiently. For this reason, computer-aided design tools have been developed.

Placement by Partitioning

Various software algorithms which place logic into a VLSI device are discussed in "VLSI Cell Placement Techniques", K. Shahookar and P. Mazumder, ACM Computing Surveys, Vol. 23, No. 2, June, 1991 (pages 143–220). The five algorithms identified in this article are placement by partitioning, simulated annealing, force-directed placement, numerical optimization techniques and placement by genetic algorithm. Although two or more algorithms may be used during the layout process of VLSI design, the present invention is concerned with placement by partitioning.

The presently used placement by partitioning algorithms find their root in U.S. Pat. No. No. 3,617,714, entitled "Method of Minimizing the Interconnection Cost of Linked Objects", issued to Kernighan and Lin on Nov. 2, 1971. Also see B. W. Kernighan and S. Lin, "An Efficient Heuristic Procedure for Partitioning Graphs", Bell Systems Technical Journal, Vol. 49, February, 1970, pp. 291–308.

The Kernighan and Lin placement by partitioning algorithm, also referred to as "min-cut" placement, is a numeric algorithm wherein a circuit design is repeatedly partitioned into smaller and smaller groups of constituent elements while the number of nets interconnecting one group to another group is kept to a minimum. In minimizing the number of interconnecting nets, the min-cut algorithm attempts to create an efficient physical layout of the elements for implementation on a VLSI chip.

Partitioning a circuit design may be done from the bottom up or from the top down, or both. Bottom-up partitioning begins with grouping individual elements of a circuit design into larger units. Copending application Ser. No. 07/456,010 [attorney docket M-904] describes such a method. Top-down partitioning begins with dividing the entire circuit design into two sections, then four, and so forth until a stop condition is satisfied. The algorithm presented in this application incorporates the latter of these two methods.

The top-down min-cut algorithm first identifies each element of a circuit design, and each element's interconnection with every other element of the circuit design. For instance, an AND gate may be designated as element 1. Element 1 may have two inputs from elements 2 and 3, and have one output to element 4. Each of the interconnections between element 1 and elements 2, 3 and 4 is given a value of one.

The min-cut algorithm begins by arbitrarily partitioning (dividing) the total number of elements of the circuit design into two groups. For instance, as shown in FIG. 5a, if a circuit design has 100 elements, the algorithm would divide the elements into subcircuit groups 1 (elements $a_1$ to $a_{50}$) and 2 (elements $b_1$ to $b_{50}$). A partition "line" PL is defined as an imaginary line disposed between the two groups. Some elements of subcircuit group 1 are typically connected to elements in group 2. For example, element $a_3$ is connected only to elements $a_2$ and $a_5$, while element $a_4$ is connected to elements $a_6$ in group 1 and also to elements $b_3$ and $b_5$ in group 2. Ideally, if all subcircuit group 1 elements were only connected to other group 1 elements, then efficiency would be maximized because no nets would be cut by partition line PL. However, it is not usually possible to divide the elements of a circuit design without having at least one net which crosses partition line PL to interconnect resulting subcircuit groups. Nets which connect elements of different subcircuit groups, and therefore cross partition lines, are commonly referred to as being "cut" by the partition line. The aim of the min-cut algorithm is to minimize the number of interconnecting nets cut by the partition lines.

After the elements have been divided into two subcircuit groups, an initial count is made of the number of cut nets. For instance, four nets are shown to be cut by partition line PL in FIG. 5a. The algorithm then systematically exchanges each of the elements of the two subcircuit groups, and the number of cut nets resulting from each exchange are counted and stored. After the storage of each cut net count, the elements are returned to their original subcircuit group and a next pair of elements are exchanged. FIG. 5b illustrates an exchange between elements $a_4$ and $b_3$. As shown, the calculated cut net count is seven, which is an increase of three cut nets above the initial cut net count of four shown in FIG. 5a. "Gain" is calculated by subtracting the initial cut net count from the calculated cut net count. Therefore, the exchange of elements $a_4$ and $b_3$ resulted in a "gain" of +3, which indicates a degradation caused by the exchange. Similarly, FIG. 5c shows an exchange of elements $a_1$ and $b_5$. As shown, the resulting calculated cut net count is three, yielding a gain of −1. After every combination of elements has been exchanged, the gains from each exchanged pair of elements are compared and the best gain (lowest calculated cut net count) is identified and stored. The elements which were exchanged to obtain the best gain are then "swapped" between the subcircuit groups and then ignored by the algorithm in the next exchange cycle. For example, if the swap shown in FIG. 5c between elements $a_1$ and $b_5$ yielding a gain of −1 is determined to be the best gain, elements $a_1$ and $b_5$ would be ignored by the algorithm, leaving 49 elements to be partitioned in each of the two subcircuit groups. The swapping process is then repeated for the remaining 49 "a" and 49 "b" elements in each of the two subcircuit groups. After each exchange cycle, the two exchanged elements yielding the best gain are swapped and then ignored and the best gain is stored. Ultimately, every element in each group is swapped, and a value representing the best gain for each swap is stored.

It should be noted that the swap of elements resulting in a "best gain" may represent a larger number of cut nets than before the swap of elements. For example, the gain resulting from the exchange shown in FIG. 5b may represent a best gain of +3. In this situation, the best gain may be thought of as a "least degradation" value. In any event, the best gain or "least degradation" number is stored as a best gain value. This practice recognizes that some swaps may yield short term increases in the number of cut nets, but subsequent swaps may result in an eventual decrease in the number of cut nets.

The algorithm then compares all 50 of the best gain values from the swapping sequences, and determines which of the 50 swaps resulted in a lowest best gain value. The algorithm then "keeps" all of the swaps occurring before the lowest best gain swap and all swaps occurring after the lowest best gain swap are undone. At this point subcircuit group 1 contains several "b" elements and subcircuit group 2 contains several "a" elements. All original and newly acquired subcircuit group 1 elements are then renumbered as "a" elements and subcircuit group 2 elements are renumbered as "b" elements. At this point the algorithm repeats the exchanging and swapping sequences for all 50 newly designated "a" elements and 50 newly designated "b" elements.

An exchange and swapping sequence which terminates with a lowest best gain value which is zero or positive indicates no swap of elements between subcircuit groups 1 and 2 resulted in fewer cut nets than the number of cut nets prior to the sequence. At this point, the algorithm terminates the task of partitioning the elements of subcircuit groups 1 and 2. The algorithm then arbitrarily partitions each of subcircuit groups 1 and 2, sequentially, into two pairs of subcircuit groups, each having 25 elements, and repeats the exchange and swapping sequences described above for each of the pairs of groups. This process continues until an end condition is satisfied, such as when each subcircuit group contains a predetermined number of elements or each group is connected by a predetermined number of nets. At this point the Kernighan and Lin min-cut algorithm ends.

The original min-cut algorithm is limited in various ways, and numerous modifications have been proposed. One limitation is that the two groups created by a partition are required to contain an equal number of elements. An improved min-cut algorithm developed by C. M. Fiduccia and R. M. Mattheyses modifies the original min-cut algorithm by allowing a selectable imbalance between two subcircuit groups. The Fiduccia/Mattheyses modified algorithm does not swap pairs of elements across a partitioning line but rather picks a single element in one group and moves it to the other group. The algorithm then checks for a decrease in the number of interconnecting nets cut by the partitioning line. The algorithm also checks the imbalance which is created by such a move. If the move creates an imbalance above a predetermined threshold, then it is undone.

Another limitation is that the original min-cut algorithm treats all cut nets as having an equal "cost". That is, every cut net is given a "cost" of one, and the total number of cut nets is simply their sum. However, it is recognized that some nets are more "important" than others. A high fan-out signal such as a clock line might be given low priority while a multiplexer output which is part of a critical path or a carry line between arithmetic digits might have high priority. A modified min-cut algorithm developed by C. Sechen and Dahe Chen assigns a weighted cost to each net. Nets which are determined to be important are given a high cost, for instance, two or five. Nets which are unimportant are given a low cost such as 0.5 or 0.0. The result is that the Sechen/Chen min-cut algorithm recognizes gains which may not be recognized using the original min-cut algorithm.

Sechen and Chen also generate a cost for cut nets that is lower when the pins on the net are unbalanced on the two sides of a cut. This improved cost function leads the min-cut optimizations to move whole nets to one side of the cut line.

Early min-cut algorithms are also limited in that they do not include means for identifying orthogonal (two-dimensional) coordinates for the subcircuit groups created by partitioning. As mentioned above, the layout process of VLSI design involves placement of elements on a two-dimensional silicon substrate or into FPGAs which have a fixed matrix of CLBs. Therefore, simply dividing elements into groups does not identify their location on an X-Y plane.

An improved min-cut algorithm developed by M. A. Breuer assigns X and Y coordinates to the subcircuit groups as they are partitioned. Each sequential partition line dividing a subcircuit group into two or more smaller groups is alternately designated as "vertical" or "horizontal". In addition, each element is assigned associated X-range values (X-lo and X-hi), and Y-range values (Y-lo and Y-hi). For example, prior to any partitioning, all elements may receive X-range values of X-lo= 0.0 and X-hi=1.0, and Y-range value of Y-10=0.0 and Y-hi=1.0. Each time a group is partitioned, the partitioning lines designated as "horizontal" divide each group into two subgroups, each subgroup having new Y-range values. Similarly, partition lines designated as "vertical" divide each group into two subgroups, each subgroup having new X-range values.

For instance, assume all elements initially have X-range values of X-lo=0.0 and X-hi=1.0 and Y-range values of Y-lo= 0.0 and Y-hi=1.0 prior to the first partitioning cut. If the initial cut is designated "vertical" and divides the design logic into two groups, then the X-range values assigned to the elements of one group are changed to, for example, X-lo=0.0 and X-hi=0.5, and the X-range values assigned to the second group are changed to X-lo=0.5 and X-hi=1.0. Likewise, when each of these two groups is subsequently partitioned, the cut is designated "horizontal" and the two groups are divided into four subgroups with two of the subgroups having Y-range values of, for example, Y-lo=0.0 and Y-hi=0.4, and two subgroups having Y-range values of Y-lo=0.4 and Y-hi=1.0. The subgroups are partitioned independently and their range values may be different. The subgroups are similarly divided until a stop condition is satisfied. When the stop condition is satisfied, the orthogonal coordinates describing the location of each group on the substrate or FPGA is determined by the X- and Y-range within which the group falls.

A problem arising from assigning X- and Y- range values to groups of elements is addressed by a modified min-cut algorithm developed by A. E. Dunlop and B. W. Kernighan, which is commonly referred to as "terminal propagation". The problem is illustrated in FIGS. 6a–6c. As shown in FIG. 6a, initial partitioning of a group of elements results in at least one net $n_1$ connecting two elements $a_1$ and $b_1$ crossing partition line $P_1$. The problem occurs when subsequent partitioning divides each of these groups into two or more subgroups. Because each exchange and swapping sequence is concerned only with the partition line dividing the two subcircuit groups being considered, the min-cut algorithm fails to account for elements of the two groups which are connected to elements in groups other than the two groups being partitioned. For instance, subsequent partitions may result in the elements $a_1$ and $b_1$ being moved to orthogonally remote X and Y positions, as shown in FIG. 6b. Dunlop and Kernighan developed a modified algorithm which addresses this problem by assigning a "dummy" element $a_1'$ (shown in FIG. 6c) to a location adjacent the partition line separating elements $a_1$ and $b_1$. The dummy element $a_1'$ is "connected" by nets $n_1'$ and n to elements $a_1$ and $b_1$, respectively. The dummy elements represent external pins and cannot be moved because the pins are not considered to be part of the groups being partitioned. As subsequent partitioning occurs, the net $n_1'$ prevents the movement of the element $a_1$ to an X-Y position which is remote from the element $b_1$, unless sufficient gain results from the movement.

Since the introduction of the min-cut algorithm, a number of improvements and/or variations to its approach have been reported. Some of these improvements are mentioned above. For other improvements, see for example, "Analysis of Placement Procedures for VLSI Standard Cell Layout", Mark Hartoog, 23rd Design Automation Conference, IEEE, 1986, pp. 314–319. See further: "A Class of Min-Cut Placement Algorithms", Melvin Breuer, University of Southern California, 16th Design Automation Conference 1977, pp. 284–290; "Circuit Layout", Jiri Soukup, Bell Labs, Proc. IEEE, vol. 69, October 1981, pp. 1281–1304; and "Optimization by Simulated Annealing", S. Kirkpatrick et al., IBM, Science vol. 220, May 13, 1983, pp. 671–680.

SUMMARY OF THE INVENTION

A modified partitioning method for placement of a circuit design into a PICD, the PICD having a specific distribution of physical resources corresponding to a specific circuit structure. The specific circuit structure can be, for instance, the three-state bus structure described above. The specific circuit structure can also be any circuit structure determined by a PICD manufacturer as being supported by a particular physical distribution of resources on the PICD.

The modified placement method of the present invention begins by analyzing the elements of the circuit design and determining if specific circuit elements are present. In its simplest form, the modified partitioning method according to the present invention then restricts partitioning of the specific circuit elements such that these elements are placed in locations corresponding to the physical distribution of resources on the PICD which support the specific circuit structure.

In one embodiment of the modified partitioning method according to the present invention, the step of partitioning further includes the steps of forming into a cell the identified specific circuit elements and performing a first phase of partitioning wherein the cell and the remaining elements of the plurality of circuit elements are partitioned until a stop condition is satisfied. This stop condition may be, for instance, when the cell is partitioned into a group containing no other elements. The group containing the cell defines an area and a location associated with the PICD. The cell is then decomposed such that the contents of the group containing the cell change to include the specific circuit elements. The group containing the specific circuit elements is then partitioned so that the area and the location of the group correspond to the specific physical distribution of resources.

In another embodiment the physical distribution of resources into which the specific circuit elements are placed is aligned along horizontal long lines of an FPGA. In this embodiment, second phase partitioning of the group containing the specific circuit elements is limited to vertical partitioning lines so that the specific circuit elements are placed to contact a common horizontal long line.

In another embodiment of the modified partitioning method according to the present invention, the step of decomposing the cell includes adjusting an X-range value and an orthogonal Y-range value associated with the group, such that the group is associated with a small area and location corresponding to the specific physical distribution of resources.

In another embodiment of the modified partitioning method according to the present invention, the step of adjusting the Y-range value and the X-range value includes constricting the Y-range and expanding the X-range such that the group is aligned along a horizontal strip corresponding to the specific physical distribution of resources. The direction of partitioning cuts is then restricted to vertical in order to prevent misalignment along the horizontal strip.

In yet another embodiment, useful when the specific circuit structure has horizontal characteristics different from its vertical characteristics, instead of assigning to a cell those elements which must be associated with the specific circuit structure, the algorithm assigns two weights to each line leading to or from the elements, one for cutting in the horizontal direction and one for cutting in the vertical direction. Weights which are heavily enough different in the two directions cause the min-cut algorithm not to separate elements in one direction but allow separation in the other direction. In this embodiment, there is no forming of elements into a cell, with subsequent partitioning of the cell and other elements, followed by ungrouping. The asymmetrical result is achieved simply through the weighting.

In still another embodiment, grouping occurs, but applies in one dimension only. For the example of elements to be placed along a horizontal line, the grouping will prevent partitioning of the group across a horizontal cut line but allow partitioning across a vertical cut line as though there were no grouping. In this embodiment the steps of ungrouping and subsequent partitioning are not needed.

As mentioned above, the present invention may be used for both field programmable devices such as PLAs and FPGAs. It may also be used for mask programmable devices such as ASICs. In one embodiment for ASICs, some metal layers are etched and formed as part of a standard device, and additional metal layers are masked, etched, and otherwise formed as part of a custom device. For example, buffer connections to long lines of a bus can be part of a standard device and inputs to the buffers can be custom programmed using a different layer of metal.

DETAILED DESCRIPTION OF SEVERAL EMBODIMENTS

The modified partitioning method of the present invention overcomes many of the limitations of the prior art min-cut algorithms and provides incentive to use min-cut for initial placement of a circuit design into a PICD.

The modified partitioning method of the present invention is presented below in four parts. First, a discussion is provided of a xilinx 4000-series FPGA to which the modified partitioning method is advantageously applied. Included are discussions of special partitioning problems associated with FPGAs and a specific example regarding a three-state buffer (Tbuf) problem associated with Xilinx 4000-series FPGAs. Second, a general algorithm according to the present invention is presented which discusses the modified partitioning method as applicable to PICDs. Four embodiments are discussed. Third, pseudocode for the first embodiment of the modified partitioning method is presented which addresses the Tbuf problem associated with xilinx 4000-series FPGAs, which is discussed above. Fourth, the pseudocode is further explained by application of the pseudocode to the Tbuf problem.

1. Field Programmable Gate Arrays (FPGAs)

Programmable integrated circuit devices (PICDs) may be configured by an end-user to provide a desired logic function. PICDs are usually comprised of a pattern of logic elements connected by programmable interconnections. PICDs are configured to perform a desired logic function by connecting the logic elements together using the programmable interconnections. In some PICDs, special logic elements such as function generators are also configurable to perform logic functions representing a combination of basic logic elements. PICDs include programmable logic arrays (PLAs) and field-programmable gate arrays (FPGAs). This invention is described in connection with FPGAs but may also be used for programming mask-programmable gate arrays or application-specific integrated circuit devices (ASICs).

Figure 1:
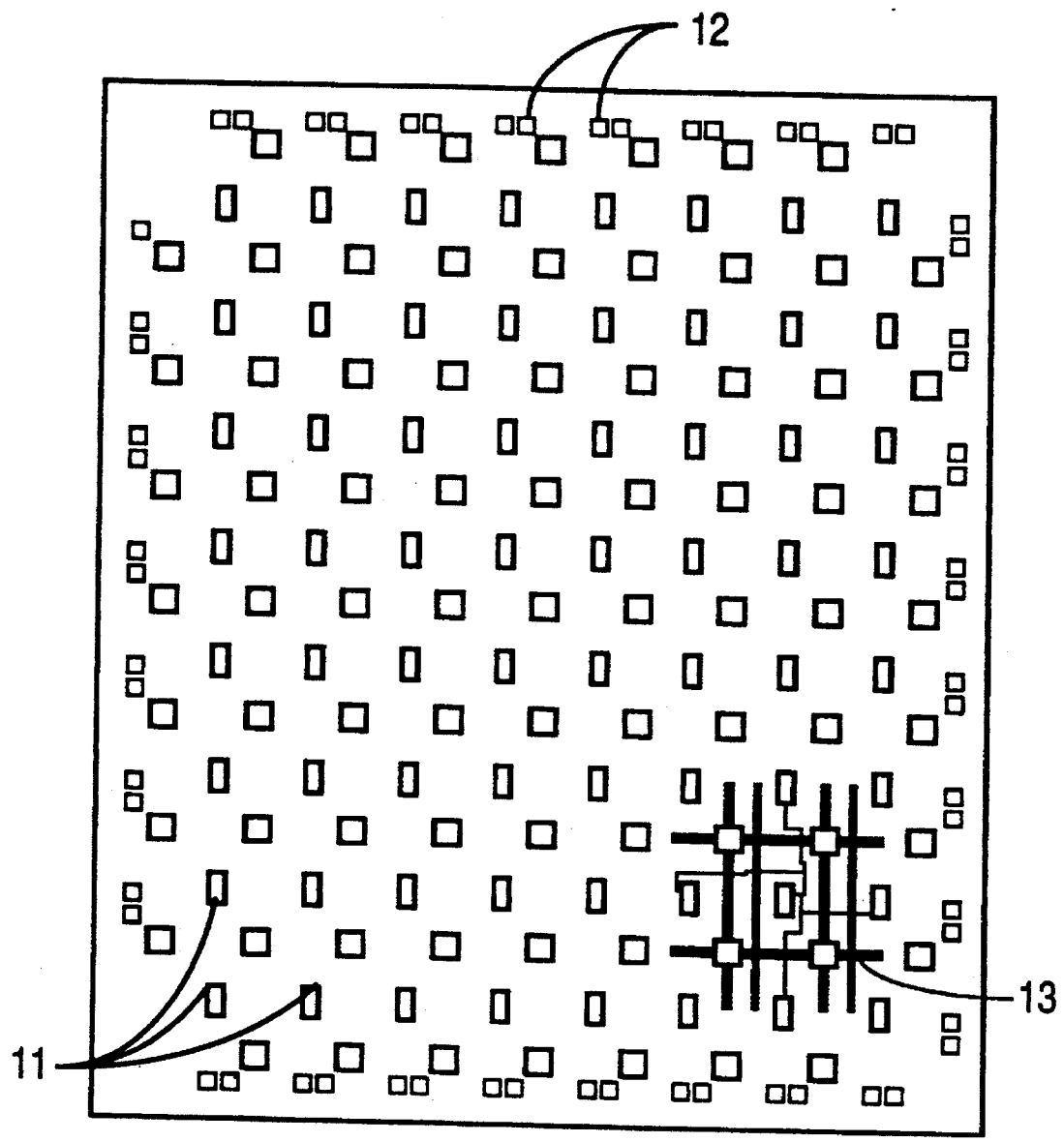
FIG. 1 is a plan view of a prior art FPGA.

An FPGA is typically organized as shown in FIG. 1. FPGAs are generally characterized in that they consist of a matrix of configurable logic blocks (CLBs) 11 surrounded by input/output blocks (IOBs) 12. In FIG. 1 lines 13 drawn between the rows and columns of CLBs are provided for showing a network of interconnect resources which can be configured to provide desired connections between two or more CLBs and between CLBs and IOBs. In an actual FPGA chip these interconnect resources are not necessarily disposed between the CLBs and IOBs, but may be disposed above the CLBs and IOBs.

Figure 2:
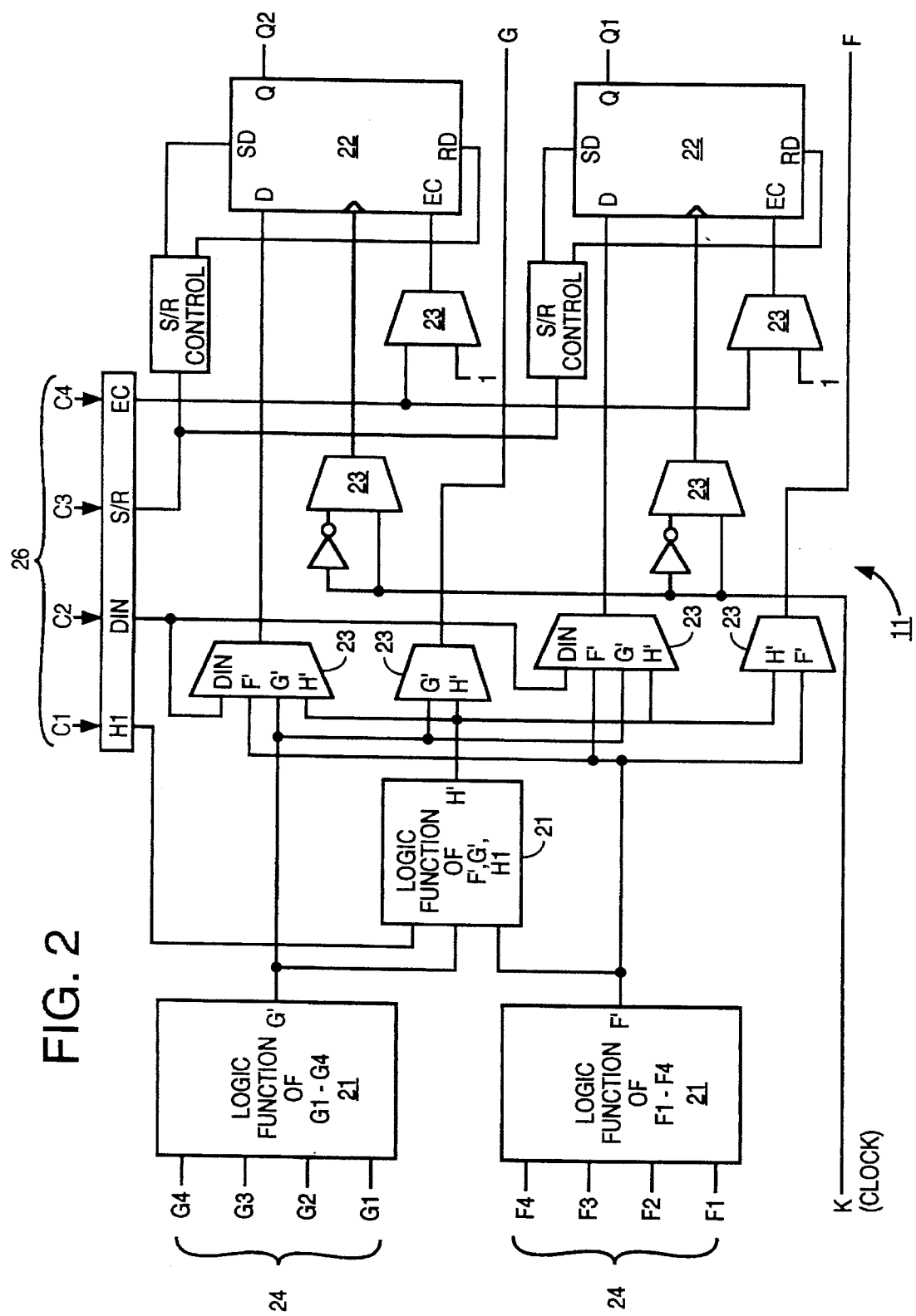
FIG. 2 is a simplified circuit diagram showing a CLB from a Xilinx 4000-series FPGA.

An example of a CLB used in a Xilinx, Inc. 4000-series FPGA, to which the method according to the present invention is advantageously applied, is shown in FIG. 2. The CLB 11 of FIG. 2 contains F, G and H programmable combinational logic (function generator) cells 21, two flip-flops 22, and an internal control section 23. There are eight logic signal inputs 24, a common clock input 25, and four control inputs 26. The combinational logic cells 21 are capable of implementing any Boolean function of their logic inputs 24. Data input for either flip-flop 22 within the CLB is supplied from the outputs of the combinational logic cells 21, or the control inputs 26.

Figure 3:
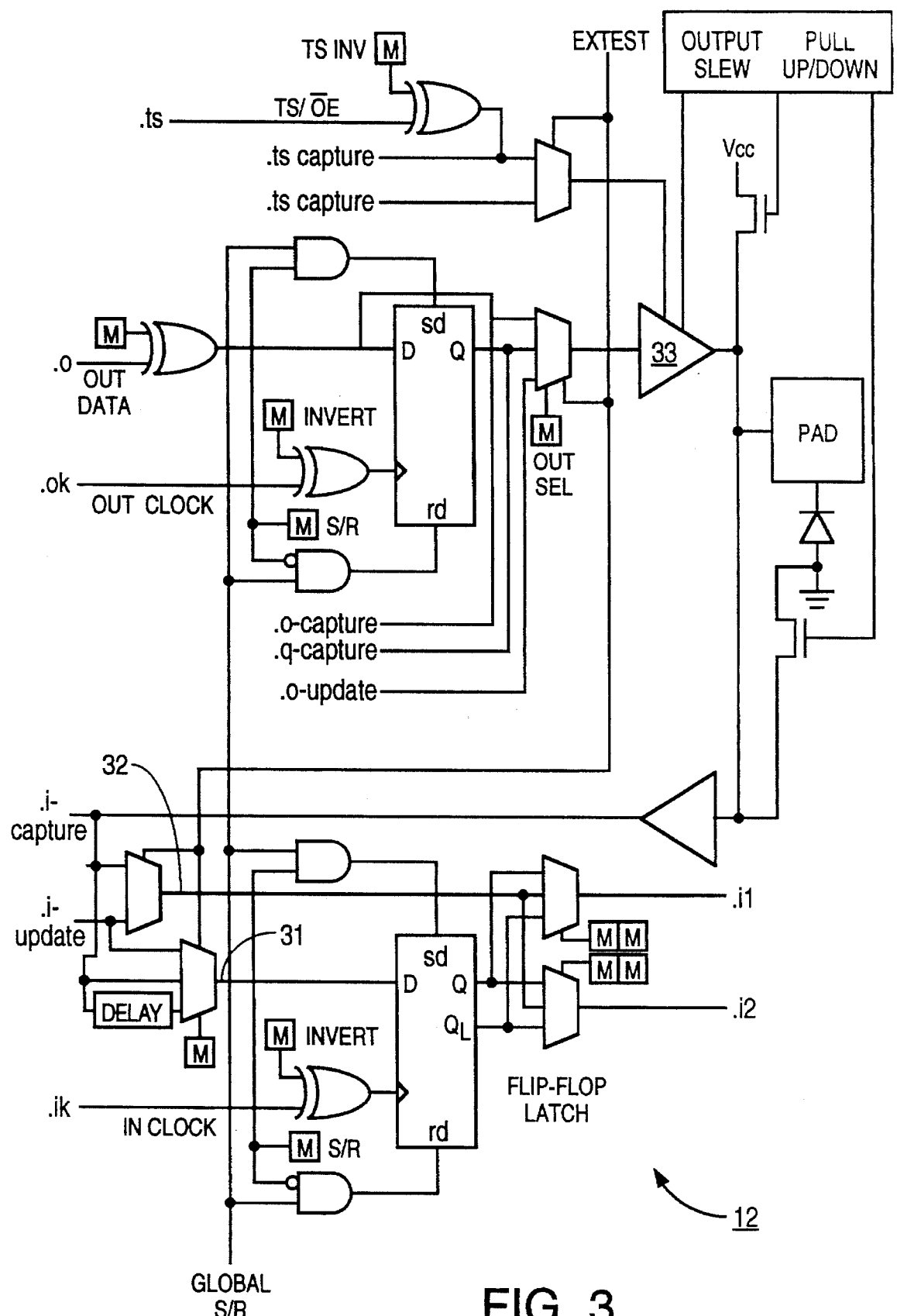
FIG. 3 is a simplified circuit diagram showing an IOB from a Xilinx 4000-series FPGA.

The periphery of the FPGA is made up of user programmable IOBs. An example of an IOB 12 used in the Xilinx 4000-series FPGA is shown in FIG. 3. The IOB 12 includes both registered input paths 31 and direct input paths 32. Each IOB provides a programmable 3-state output buffer 33, which may be driven by a registered or direct output signal. Each IOB also provides input clamping means and means to inhibit latch-up produced by input currents.

Figure 4:
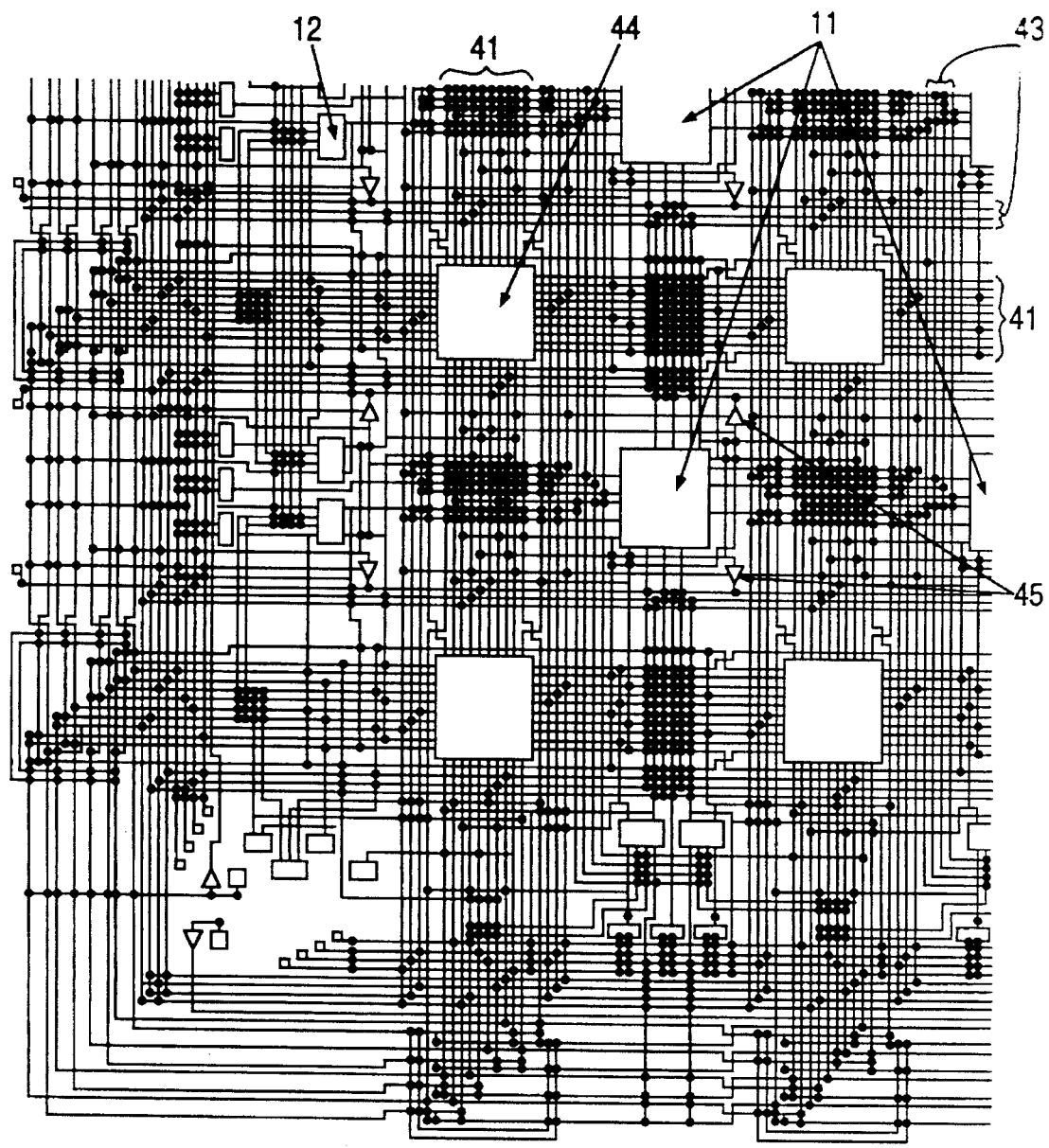
FIG. 4 is a circuit diagram showing the placement of CLBs, IOBs and Tbufs on a Xilinx 4000-series FPGA.
Figure 5A:
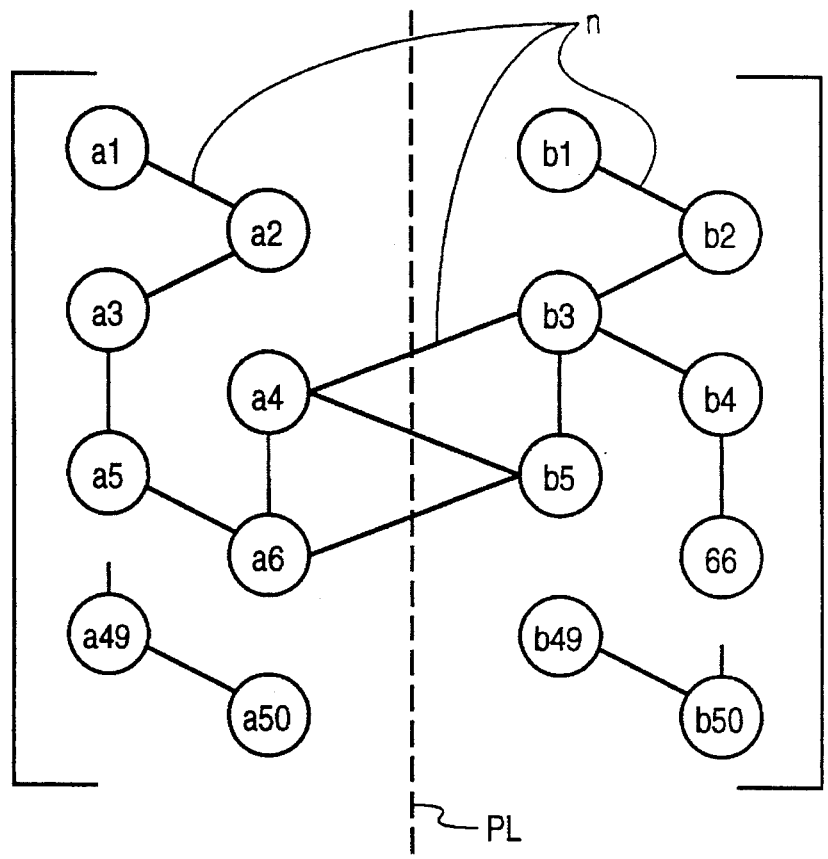
FIGS. 5a–5c illustrate the basic prior art min-cut algorithm.
Figure 5B:
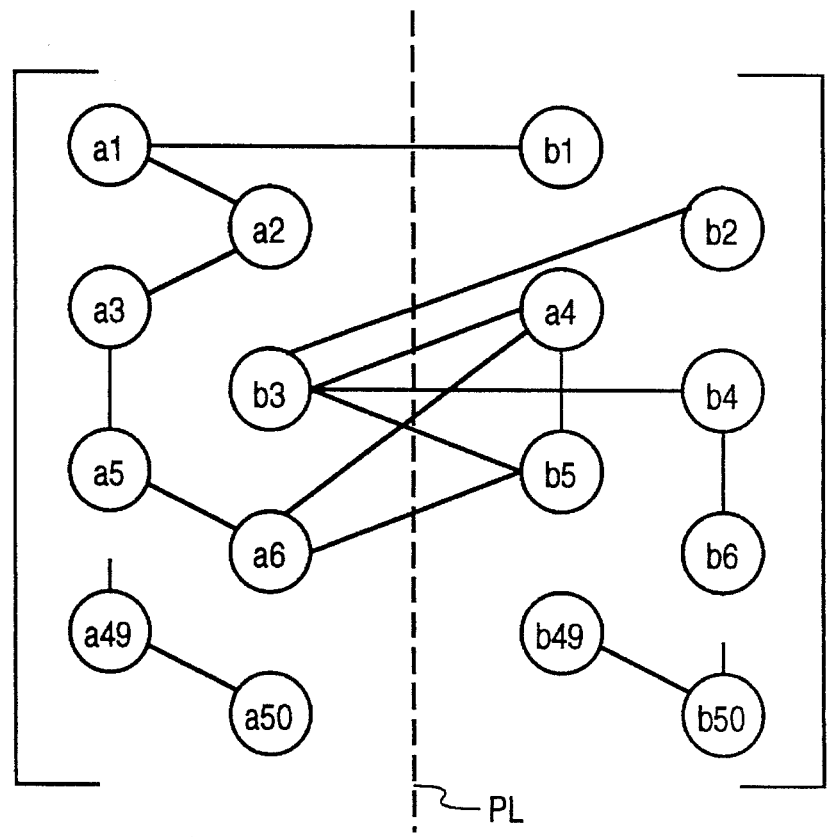
Figure 5C:
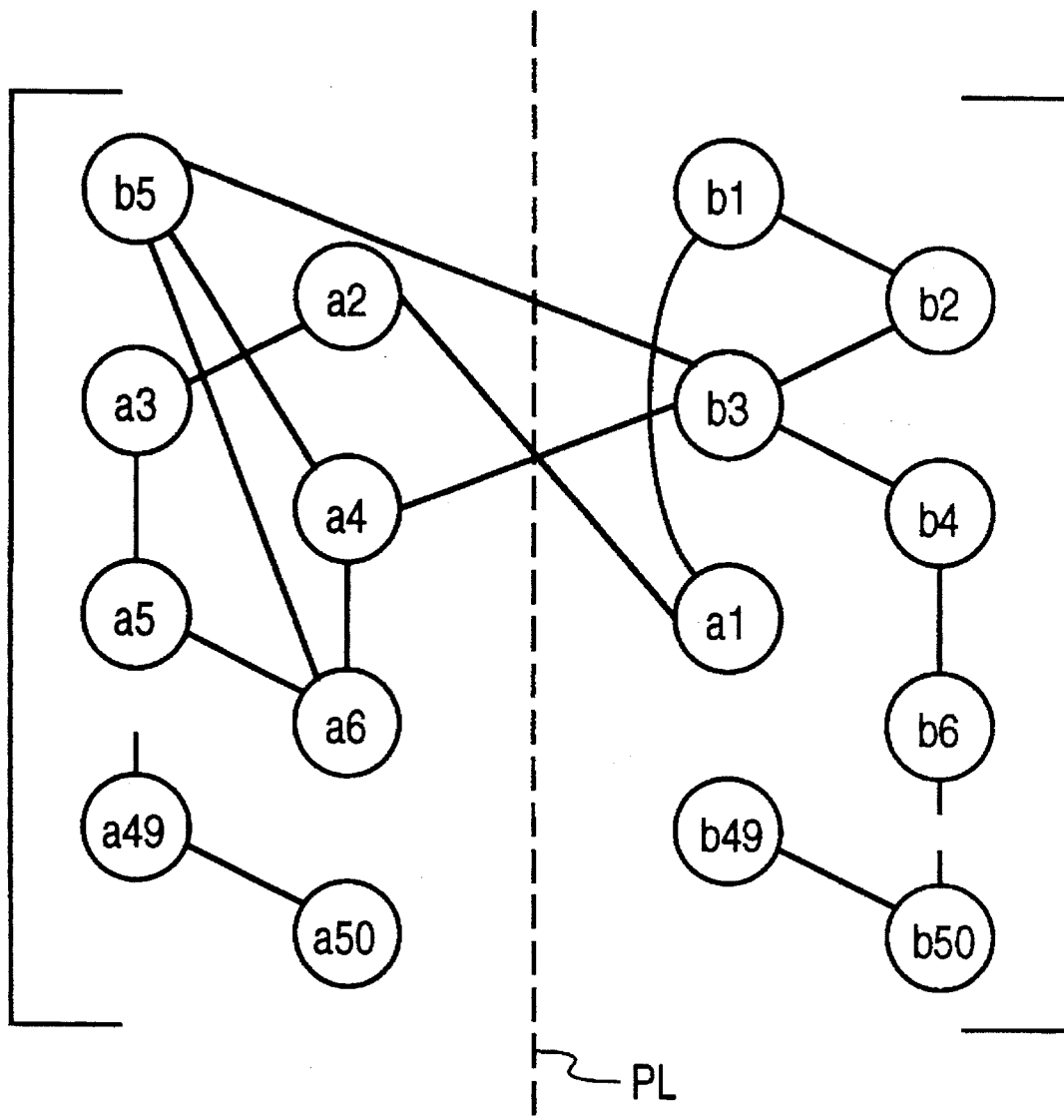
Figure 6A:
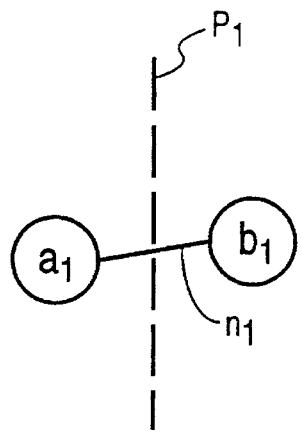
FIGS. 6a–6c illustrate the prior art terminal propagation min-cut algorithm.
Figure 6B:
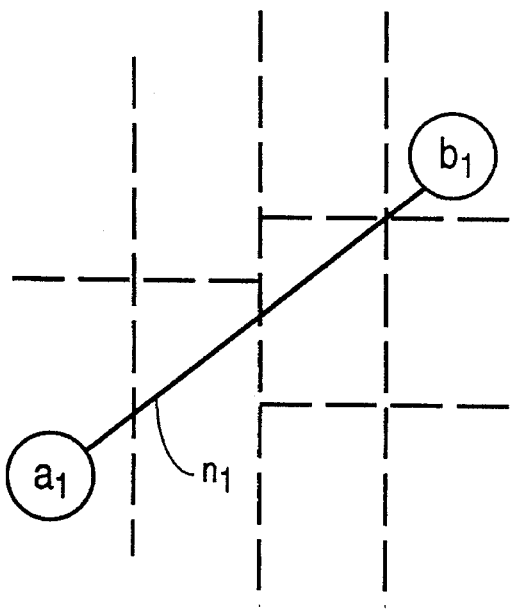
Figure 6C:
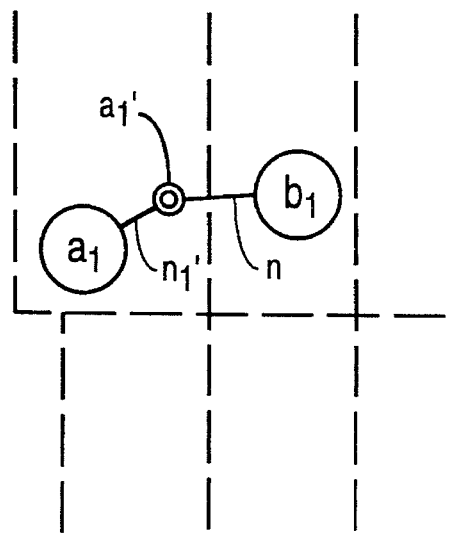

The matrix of CLBs and IOBs are linked by programmable interconnect resources which are configurable to create desired connections between the IOBs and CLBs. An example of the interconnect resources used in the Xilinx 4000-series FPGAs is shown in FIG. 4. The interconnect architecture includes general purpose interconnect lines 41 and long lines 43.

General purpose interconnect lines 41 consist of a grid of horizontal and vertical metal segments located between the rows and columns of CLBs and IOBs. Switching matrices 44 join the ends of these segments and allow programmed interconnections between the horizontal and vertical segments.

Long lines 43 bypass the switching matrices 44 and are intended primarily for signals that must travel a long distance, or must have minimum skew among multiple destinations. (Skew is the difference between maximum and minimum delay between source and all destinations on a single conductive path. A path through several transistors will incur RC delay as the signal passes through the transistors.) Each interconnection column has vertical long lines, and each interconnection row has horizontal long lines. Long lines can be driven by a CLB or IOB output on a column-by-column basis. This capability provides a common low skew control or clock line within each column of CLBs.

In addition to the CLBs, IOBs and interconnection resources available on the Xilinx 4000-series FPGA are a set of three-state buffers (also referred to as Tbufs). FIG. 4 shows that a pair of Tbufs 45 are connected to an output of each CLB, and permits the CLB to drive two of the horizontal long lines to provide multiplexing functions.

The above described Xilinx 4000-series FPGA is further described in "XC 4000 Logic Cell Array Family", copyright 1990, Xilinx Inc., and available from xilinx, Inc. at 2100 Logic Drive, San Jose, Calif., 95194. This publication is incorporated by reference.

FPGAs and Placement by Partitioning

FPGAs and computer-aided design tools are recognized as making possible complete automation of VLSI design. Computer-aided design tools include graphics systems which aid circuit design, and computer software for automatically placing and routing the circuit design into an FPGA. Placement may be implemented using one or more of the software algorithms mentioned in the Shahookar and Mazumder article discussed above.

Placement and routing of a circuit design into an FPGA introduces problems which are not present in the layout of custom circuits. An analogy is planning the layout of a city. In custom circuits, a planner begins essentially from bare land. Decisions regarding the placement of elements, similar to the placement of industry, residential and emergency structures, can be made prior to construction. In addition, necessary interconnection lines, similar to roadways and highways, can be anticipated and necessary space can be set aside. However, layout using FPGAS is analogous to a city planner being provided a previously constructed group of structures and roadways, and deciding where people will live and work. The decisions now become how to use the established CLBs, IOBs and interconnection lines most efficiently while avoiding problems analogous to placing factory workers too far from a factory, or forcing too many commuters to crowd onto a two-lane road while a four-lane highway remains empty.

One algorithm which may be used to simplify the placement of elements of a circuit design into a Xilinx 4000-series FPGA is taught in copending, commonly assigned U.S. patent application Ser. No. 07/613,189 [attorney docket no. M-1400] which is incorporated by reference. This algorithm teaches the duplication of basic logic components (i.e., gates) so that they can be implemented by existing combinational logic cells, flip-flops and Tbufs located on a Xilinx 4000-series FPGA. This algorithm simplifies placement by reducing the number of elements considered by the placement algorithm.

In the discussion below, placement is considered to include two overlapping steps: partitioning and placement. Partitioning is used to divide elements into groups which fit into CLBs and IOBs and to provide initial or "rough" placement of the circuit design. Partitioning is followed by final placement using one of the other placement algorithms mentioned in the Shahookar and Mazumder article. The modified placement method according to the present invention teaches the use of the min-cut algorithm during the partitioning step, despite the limitations of the min-cut algorithm which are commonly known and discussed below.

Limitations of Prior Art Min-cut Algorithms

Although the min-cut algorithm can be used as a very fast rough placement algorithm, it is commonly recognized as being inefficient for use even in initial placement of circuit designs into PICDs, and in particular FPGAs. One limitation of the min-cut algorithm is that it fails to account for the physical distribution of resources on an FPGA. That is, certain associated CLBs, IOBs, interconnect lines and other elements on an FPGA are physically located in proximity to each other or aligned such that they may be conveniently and efficiently routed together to perform functions which are commonly used in a circuit design. The arrangement of the CLBs, IOBs, elements and interconnect lines is chosen by the FPGA manufacturer in anticipation of the needs of an FPGA purchaser. Because the min-cut algorithm fails to account for the physical arrangement of the FPGA resources, the min-cut algorithm will typically place elements of a circuit design poorly with respect to the available wiring resources. If the min-cut algorithm is used as an initial placement tool, the min-cut placement can generate unsolvable problems for final placement of the circuit design. Therefore, the min-cut algorithm is sometimes not used for the placement of circuit designs on FPGAs.

The limitations of prior art min-cut algorithms are better understood with the following example of a three-state bus structure placed on a xilinx 4000-series FPGA.

Three-state BUS Problem

As discussed, commonly used subcircuits are often anticipated by an FPGA manufacturer and FPGA resources are allocated to provide a suitable and efficient structure for placement of the subcircuit elements. An example of this is the location of three-state buffers 45 (FIG. 4) on a Xilinx 4000-series FPGA.

Three-state buffers (Tbufs) are elements receiving one input signal and one control signal and generating one output signal. The input signal is either high or low, and the control signal either allows the high or low input signal to be transmitted as the output signal, or prevents the input signal from being transmitted, thereby creating an "off" or high impedance output signal. The high, low and "off" output signals applied to a bus by one or more Tbufs produce a three-state bus structure.

As shown in FIG. 4, the input of each Tbuf 45 in a Xilinx 4000-series FPGA is connected to the outputs of a CLB 11. The control signal of each Tbuf is provided from one of the several interconnect lines. The output of each Tbuf is connected to one of the several horizontal long lines 43. Xilinx purposefully arranges the horizontal rows of CLBs connected to rows of Tbufs, which in turn are connected to horizontal long lines, because FPGA purchasers often have use of three-state bus structures in which one long line is driven by one of several Tbufs.

In order to place a three-state bus structure into an FPGA, a placement algorithm must identify the Tbufs that are to be physically connected to a common long line, and must place the circuit design elements associated with the three-state bus structure such that the associated Tbufs access the common long line. This task would be elementary if there were only one set of Tbufs connected to one long line on an FPGA, but actual FPGAs, such as shown in FIG. 4, contain several rows of Tbufs and several associated long lines. The problem presented by several rows of Tbufs and several long lines located on an FPGA is that unless the placement algorithm orients a three-state bus structure along a single horizontal long line, then the associated Tbufs will not drive a single line and the user will not be able to achieve a three-state bus structure.

Proper placement of a three-state bus structure is a particular problem with respect to placement-by-partitioning algorithms. Referring to the discussion above, the min-cut algorithm is not concerned with the orientation of associated elements, but only seeks to minimize the number of cut nets. Even the terminal propagation modification will not necessarily place Tbufs associated with a three-state bus structure on the same horizontal long line.

Figure 7A:
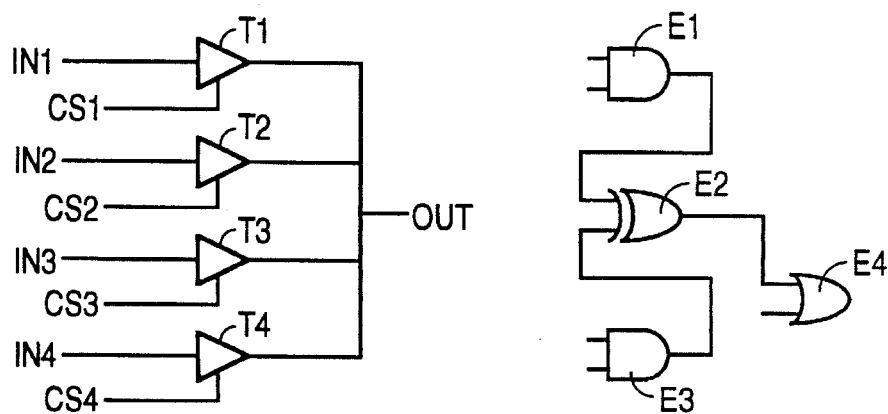
FIGS. 7a–7e illustrate the Tbuf problem addressed by one embodiment of the present invention.
Figure 7B:
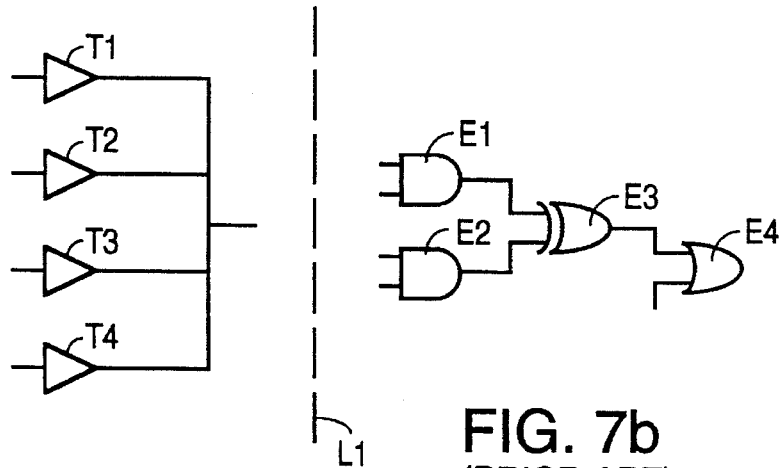
Figure 7C:
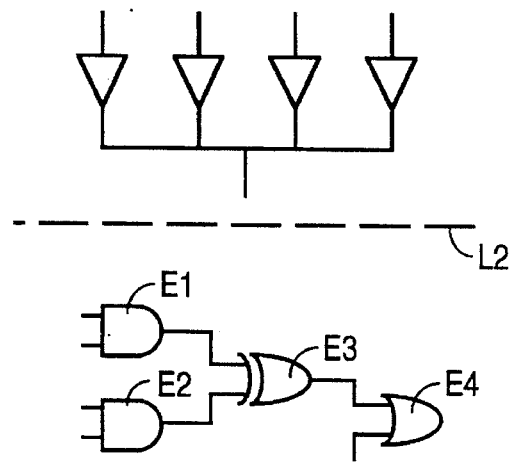
Figure 7D:
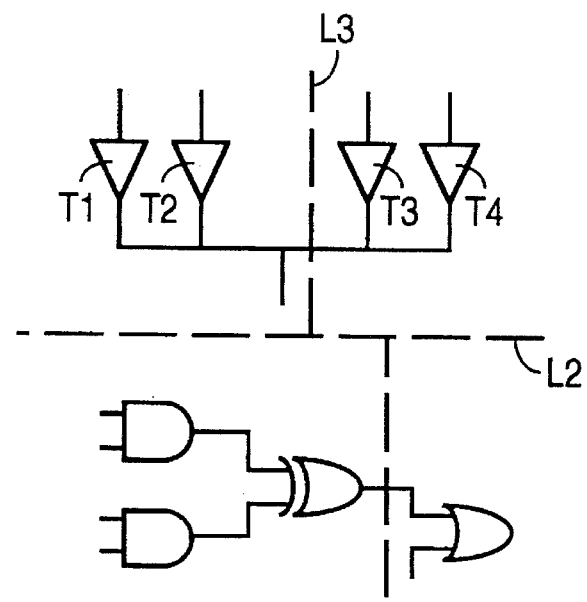
Figure 7E:
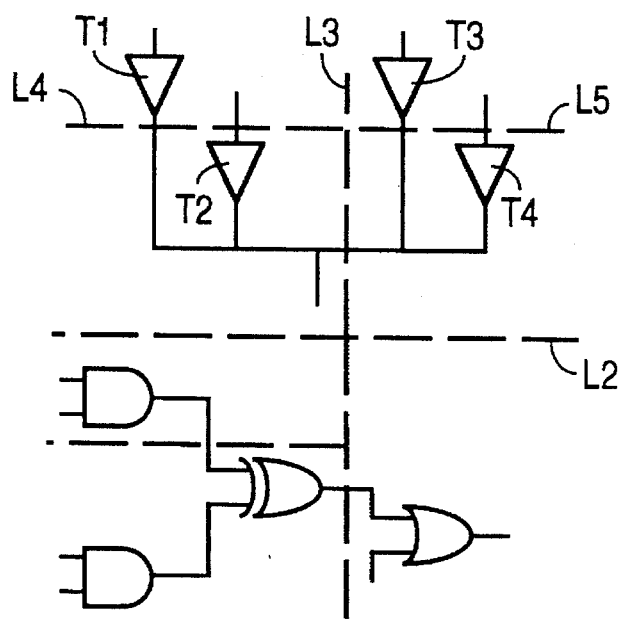
Figure 8:
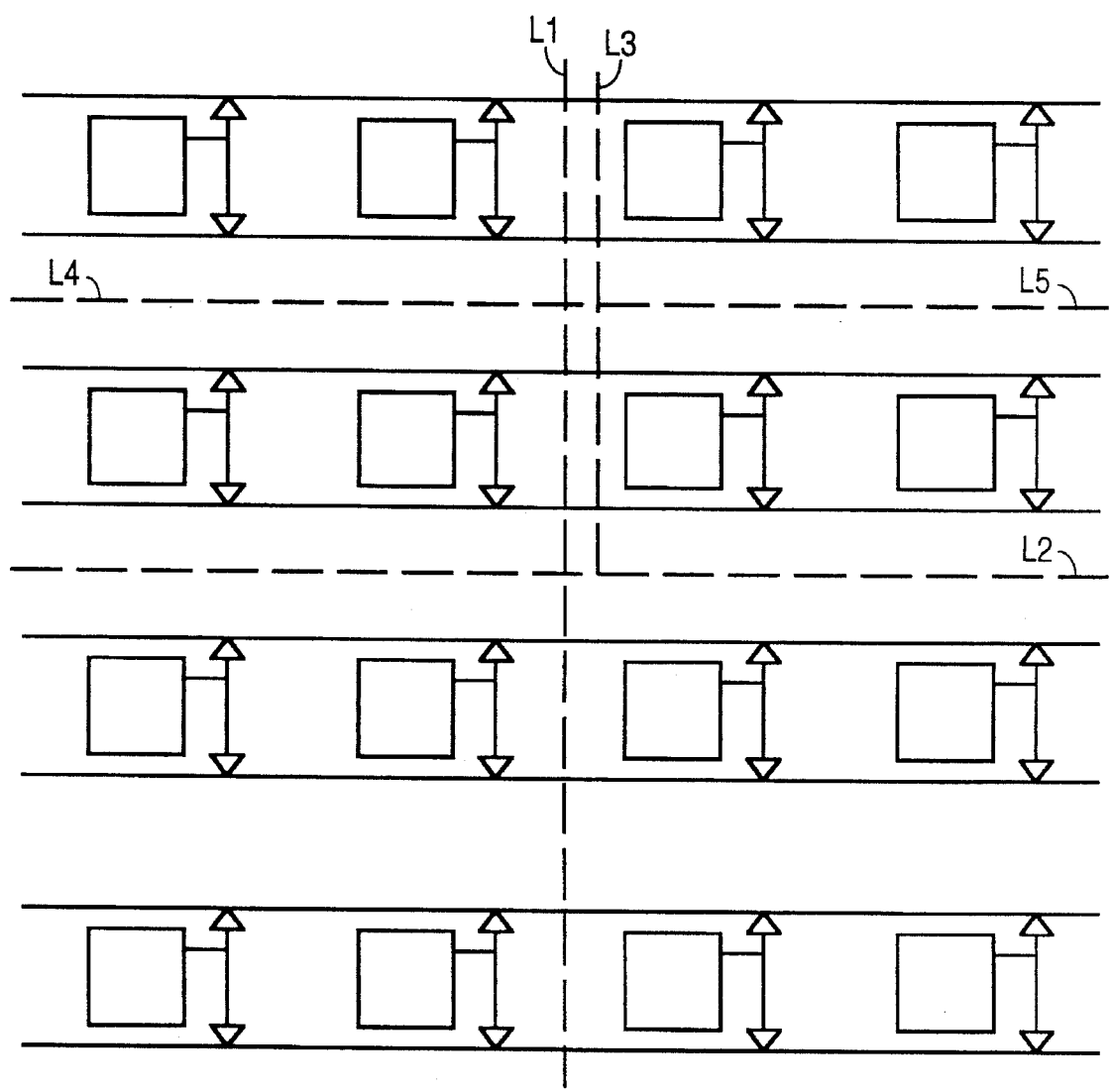
FIG. 8 is a simplified circuit diagram showing the results of partitioning using the prior art min-cut algorithm as applied to the Tbuf problem.

This problem is illustrated in FIGS. 7a–7e and FIG. 8. FIG. 7a indicates a three-state bus structure consisting of four Tbufs T1–T4. Each of the Tbufs receives one control signal and one input signal, indicated as CS1–CS4 and IN1–IN4. The outputs of Tbufs T1–T4 are connected together so that one of them may drive a common bus line. Also shown are circuit elements E1–E4 which are also part of the circuit design to be configured, but are not directly connected to the Tbufs. FIG. 8 illustrates a simplified FPGA comprised of 16 CLBs. For clarity, minimal interconnecting lines are shown. This example assumes that other elements of the circuit design have already been partitioned, and that the only remaining elements to be partitioned are Tbufs T1–T4 and elements E1–E4.

As discussed above, the min-cut algorithm will attempt to partition Tbufs T1–T4 and elements E1–E4 such that the minimum number of nets are cut. It is easily seen that the only division of elements which results in zero cut nets is to separate the Tbufs from the elements E1–E4, as shown in FIG. 7b. This division results in the following problems.

Assume that the partition line L1 is designated as "vertical". This would divide the resources of the simplified FPGA shown in FIG. 8 as indicated with line L1. The Tbufs T1–T4 of FIG. 7b would be placed to the left of line L1 in FIG. 8, and elements E1–E4 would be placed to the right of line L1. Note that there are 16 Tbufs located to the left of line L1, which would be recognized by the prior art min-cut algorithms as being sufficient to support the four Tbufs T1–T4 of FIG. 7b. What would not be recognized by the prior art min-cut algorithms is that only two of the 16 Tbufs to the left of line L1 are connected to any one of the eight long lines 43. Therefore, no subsequent partitions would result in a proper three-state bus structure wherein all four Tbufs T1–T4 would be connected to a common long line.

The same problem would eventually result if the first partition line is designated as horizontal, as indicated in FIG. 7c. This horizontal partition line is indicated in FIG. 8 as line L2. Line L2 divides the elements E1–E4 and Tbufs T1–T4 such that it appears the Tbufs could be connected to a common long line. The prior art min-cut algorithm would then attempt to partition the Tbufs T1–T4 with partition line L3, shown in FIG. 7d. Because the next partition line would be designated as vertical, the Tbufs would be divided as shown in FIG. 7d into a group containing T1 and T2, and a group containing T3 and T4. At this point it is still possible to combine the four Tbufs such that they are connected to a single long line because the line L3 (shown in FIG. 8) divides the four Tbufs and does not preclude connecting the four Tbufs to a long line located above line L1. However, because the min-cut algorithm has not reached a stop condition, the two groups of Tbufs would be further partitioned. Because the next partition lines L4 and L5 would be designated as horizontal, the Tbufs would be divided as shown in FIG. 7e, such that two of the Tbufs T1 and T3 are placed in the top two rows of Tbufs (shown in FIG. 8), and two of the Tbufs T2 and T4 are placed in the second two rows of Tbufs. Because this occurs, the prior art min-cut algorithms fail to place the Tbufs such that a proper three-state bus structure is formed.

Therefore, no matter what the direction of the initial partitioning line, the prior art min-cut algorithms fail to provide suitable initial placement of circuit design elements which require a particular relationship to each other.

2. General Algorithm

The modified placement method of the present invention begins by analyzing the elements of a circuit design and determining if a specific circuit structure is present. The specific circuit structure can be, for instance, the three-state bus structure described above. The specific circuit structure can also be any circuit structure determined by a PICD manufacturer to be supported by a particular physical distribution of resources on the PICD.

In its simplest form, the modified partitioning method according to the present invention then restricts partitioning of the elements associated with the specific circuit structure such that these elements are placed in locations corresponding to the physical distribution of resources on the PICD which support the specific circuit structure.

In a first embodiment of the modified placement method according to the present invention, the step of restricting partitioning of the elements associated with the specific circuit structure includes assigning the elements to a cell, performing a first phase of partitioning wherein the cell and the remaining elements are partitioned until the cell is isolated into its own group, then decomposing the cell into its source elements. A second phase of partitioning is then performed wherein the group containing the source elements is partitioned while restricting the direction of partitioning cuts such that the elements are placed according to the physical distribution of resources of the PICD which support the specific circuit structure. This first embodiment will be described in more detail below.

In a second embodiment of the present invention, useful when the specific circuit structure has horizontal characteristics different from its vertical characteristics, the algorithm assigns weights to lines leading to or from the elements which are different in the horizontal direction than in the vertical direction. Weights which are heavily enough different in the two directions cause the min-cut algorithm not to separate elements in one direction but allow separation in the other direction. In this embodiment, there is no forming of elements into a cell, with subsequent partitioning of the cell and other elements, followed by ungrouping.

For the Tbuf example, in a Xilinx 4000-series device, it is required that all Tbufs which drive a common bus line be placed on a common horizontal long line. So any other placement fails to produce a functional chip. For this example, crossing a vertical cut line (which does not separate elements from a common horizontal line) is given a weight near zero. However, lines which connect elements to a common bus can be given a weight for crossing a horizontal cut line larger than the total number of cut lines, so that such a cut will never be selected.

For the common clock example, it may be preferred but not required that all elements of some group be driven from the same clock signal. In this case, weight for crossing a horizontal cut line is made very small (probably less than one), and weight for crossing a vertical cut line (for creating horizontal separation) is given a relatively large weight (for example 10).

In this second embodiment, the earlier described steps in the first embodiment of (a) grouping elements into a cell, (b) partitioning until a stop condition is reached, and (c) separating elements of a cell to be further partitioned with constraints are not used. Rather the asymmetrical partitioning result is achieved by using weighting factors which relate to the importance of maintaining a particular alignment.

In a third embodiment, useful when specific circuit elements must be grouped on a single horizontal or vertical line, cells are not formed as in the first embodiment, and weights are not assigned as in the second embodiment. Instead, particular lines in the design (nets) are identified as having a constraint, namely being connected to a named line. In the Tbuf example, the net which is to serve as a bus is so marked. During min-cut partitioning, when one element which connects to a bus is separated from the others by a horizontal cut line, all other elements connected to the common bus are moved across the cut line. Thus all elements connected to a bus are moved together during min-cut partitioning. In the common clock example, the clock line is so marked and elements to be driven from this common clock line are moved together across a vertical cut line. It may be preferred not to mark elements which are preferably but not necessarily aligned vertically, since so marking will significantly restrict the placement freedom.

In a fourth embodiment, the grouping which was discussed in connection with the first embodiment applies to one dimension only. For the example of the tbufs connected to a common horizontal long line, all elements to be connected to a horizontal long line are formed into a cell which will not be partitioned by a horizontal line but may be freely partitioned by a vertical line. In this fourth embodiment, the final steps used in the first embodiment of ungrouping and further partitioning are not needed.

Figure 12:
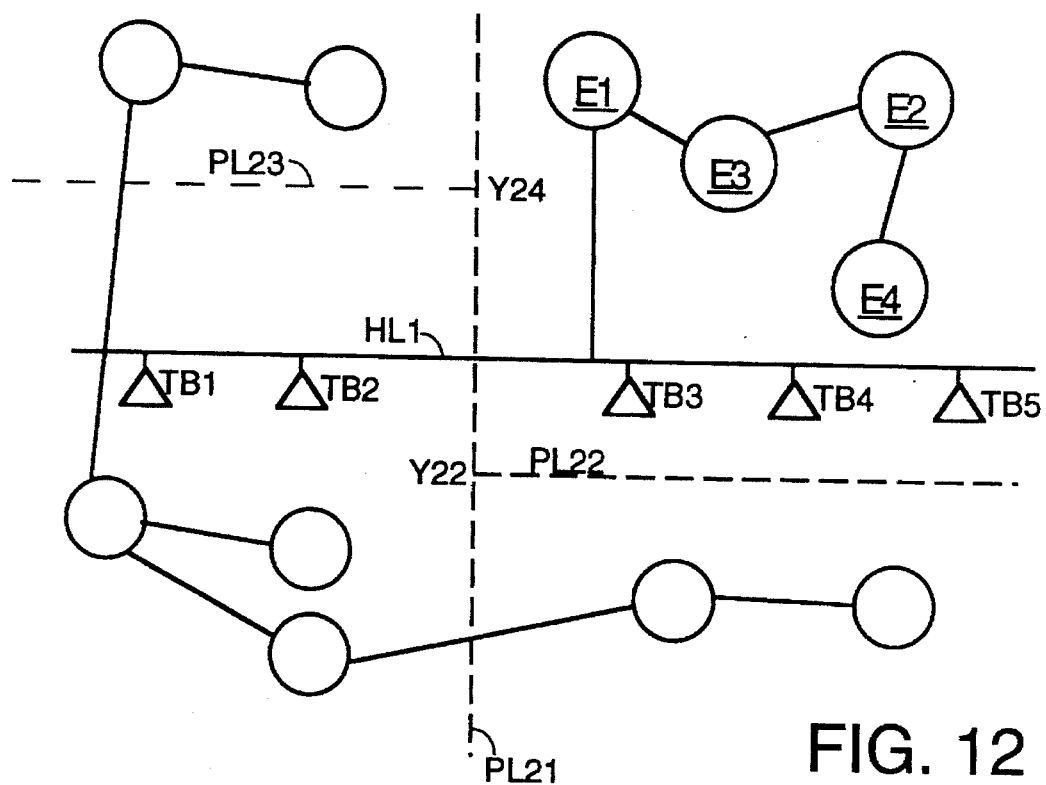
FIG. 12 illustrates a partitioning example in which elements connected to a common line are divided by a vertical line.

For the second, third, and fourth embodiments, a special precaution is needed due to the fact that vertical partitioning can place portions of a horizontal long line group into different partitions. FIG. 12 illustrates the problem and its solution. A group of Tbufs TB1 through TB5 are to be attached to a single long line named HL1. This is not yet any particular horizontal long line of the chip but simply a name for the common line. A first vertical cut shown by partitioning line PL21 has placed Tbufs TB1 and TB2 on the left side of the line and the remaining three on the right side of the line. A first horizontal cut shown by partitioning line PL22 has placed Tbufs TB3 through TB5 above the line. When the cut represented by horizontal partitioning line PL23 is being considered, it is necessary that Tbufs TB1 and TB2 be partitioned so that they can remain on the same horizontal line with TB3 through TB5. However, it is not necessary that TB1 and TB2 remain above line PL23 as illustrated in FIG. 12. To assure that horizontal alignment is maintainable, the Y-coordinate Y22 of partitioning line PL22 is examined to determine that resources are available to place TB1 and TB2 in alignment with TB3 through TB5. Similar tests are made during subsequent partitioning steps to assure that Y-coordinate ranges of portions of a common group can be aligned.

Alternatively, the partitioning cuts can be made to extend across the entire chip as discussed by Melvin Breuer, ibid. This solves the problem of assuring that pieces of a group remain together but is slower and less flexible, so is not usually preferred.

The first embodiment will now be described in detail.
First Embodiment

The steps of forming the cell, performing a first phase of partitioning, decomposing the cell and performing a second phase of partitioning will be described in greater detail immediately below.

After analyzing a circuit design to determine if the circuit design contains elements associated with one or more specific circuit structures of a PICD, the modified placement algorithm assigns the elements associated with each circuit structure to a single cell. In the preferred embodiment only position-dependent elements (elements which must be placed in a specific relation to the physical resources on the PICD) are included in the cells, but the cells may include position-independent elements (elements which may be placed more generally on the PICD) which are immediately connected to the position-dependent elements.

Note that assigning elements to a cell should not be confused with combining circuit design components (e.g., logic gates) in order to efficiently fill CLBs and IOBs in an FPGA. Combining components to fit within CLBs and IOBs involves, for instance, recognizing basic design components which can be implemented in one combinational logic cell or one flip-flop of a CLB or IOB. On the other hand, assigning elements to a cell involves assigning elements which would be implemented in, for instance, several combinational logic cells, registers and Tbufs of several CLBs or IOBs in an FPGA. Although the process of combining components is preferably used in the modified partitioning method of the present invention, it is not necessary to implement the inventive method.

After the circuit design is analyzed and all possible cells are formed, a first phase of partitioning begins for the cells and the remaining elements which are not part of one of the specific circuit structures. During this first phase of partitioning, the cells, which contain multiple elements, are identified by the partitioning program as having essentially the same "size" as single elements. That is, the number or type of source elements assigned to the cell are not taken into consideration for the purposes of the first phase of partitioning. The partitioning algorithm used may be the prior art min-cut partitioning process (described above), or any other partitioning algorithm. That is, groups including both elements and cells are initially partitioned into two groups, then four groups, etc. The first phase of partitioning terminates when all of the cells are isolated in their own group such that they are separated from all other cells and groups of elements.

Once all of the cells are isolated in their own "group" (that is, each cell is separated by one or more partition lines from all other groups containing only a single cell or one or more elements) the cells are decomposed into the source elements making up the cell. That is, the contents of the cell are replaced by its source elements. Each group of source elements (those elements from a decomposed cell) is marked to indicate that the source elements are from a particular type of parent cell. The type of parent cell from which source elements originate determines the adjustments to the X- and Y-range of the group of source elements and the restrictions on second phase partitioning of the group of source elements (discussed below).

Upon decomposition of the cell, the source elements are initially assigned the X-range and Y-range of the "group" into which the parent cell was partitioned. However, because the cell was treated as having the "size" of an element, the X- and Y-ranges into which the cell is partitioned is almost always too small to support the cell's numerous source elements. In addition, it is a main object of the modified partitioning method to arrange the source elements in a manner relating to the physical distribution of resources on the PICD. Therefore, the X- and/or Y-ranges of the source elements are adjusted according to the type of parent cells from which they originated. For instance, if the physical distribution of resources on a PICD are aligned horizontally (in the X-direction), then the X-range of the group of source elements is expanded to include the entire horizontal area bounded by the supporting resources on the PICD. In addition, if the Y-range is not sufficiently defined at the time of decomposition, the Y-range may be modified to align the elements along a specific horizontal section of the PICD. That is, if the Y-range of the group of source elements encompasses five conducting horizontal lines, and the source elements are to be aligned along one of the horizontal lines, the Y-range is adjusted to encompass only one of the five conducting lines. The X- and Y-ranges for the group may similarly be adjusted to be aligned vertically, or to assume any shape which would best account for the physical distribution of resources on the PICD. Note that the adjustment of X- and Y-ranges of a group of source elements will usually create an overlap between the group containing the source elements and other adjacent groups. This overlap problem will be addressed below.

After range adjustment, second phase partitioning is initiated during which the groups of source elements, along with all other groups, are partitioned until each group satisfies a second stop condition. However, during this second phase of partitioning, each group containing source elements from a decomposed cell is subject to restrictions determined by the type of parent cell. For instance, if all of the elements are to be aligned along a horizontal row of the PICD, then during the second phase of partitioning the group may be restricted to "vertical" partitioning cuts. This results in the source elements being partitioned to be aligned along the adjusted X-range of the group. Other possible restrictions may be applied to the group during the second phase of partitioning. For instance, the partitioning may be restricted to horizontal partitioning cuts, or a limited number of horizontal and/or vertical partitioning cuts.

Overlap

As mentioned above, it is evident that the adjustment of X- and/or Y-ranges upon decomposition and the second phase of partitioning would often result in the overlapping of elements placed in the first phase of partitioning and the source elements placed in the second phase of partitioning. That is, elements which were not grouped into cells are partitioned into particular X- and Y-ranges. If, for example, a cell is decomposed and the second phase of partitioning locates the source elements horizontally, it is evident that at least some of the source elements will be assigned to the same X- and Y-range as at least some of the elements from another group.

However, the overlap problem is not a concern in the modified partitioning method of the present invention. As mentioned above, the modified partitioning method is used only as an initial placement tool, and at least one other placement algorithm is used for final placement. The overlap problem that may occur due to the modified partitioning method according to the present invention is easily corrected during final placement.

Therefore, each group is partitioned without considering the X- and Y-range of every other group. That is, all groups having adjusted X- and Y-ranges are subject to further partitioning as if they were originally partitioned into the adjusted ranges. Similarly, all groups which overlap an adjusted group are partitioned as if the adjusted group does not exist.

As mentioned above, the preferred application of the modified partitioning algorithm is an initial or "rough" placement algorithm. Upon termination of the modified partitioning algorithm it is recognized that one or more additional algorithms, mentioned above in the Shahookar and Mazumder article, are necessary for further refining the placement of the elements of the circuit design. However, because the modified partitioning method of the present invention assigns elements into cells, partitions, decomposes the cells and then partitions the source elements subject to certain constraints, the modified method provides an efficient and relatively accurate method for initial placement of a circuit design into a PICD. Also important is that the modified method meets constraints present in the physical structure of the PICD which will implement the design.

A preferred embodiment of the modified partitioning method according to the present invention will now be described with the use of the pseudocode located in Appendix I.

3. Overview of Pseudocode

Appendix I below includes pseudocode for a partitioning algorithm according to a preferred embodiment of the present invention. The pseudocode is tailored for partitioning a circuit design for placement into a Xilinx 4000-series FPGA, described above. For the purpose of clarity, the only specific circuit structure addressed in the pseudocode is the three-state bus (Tbuf) structure, described above. Further, the pseudocode assumes only one Tbuf structure is present in the circuit design. Other specific circuit structures may be addressed by the modified partitioning method of the present invention in a similar manner.

In the pseudocode provided in Appendix I, titles of the main program and program subroutines are typed in all capitals. The main program is given first, followed by subroutines.

Operation of the pseudocode will now be described. The MAIN program begins by analyzing a circuit design. If the circuit design includes a Tbuf structure, the MAIN program calls the CREATE_TBUFS_CELL subroutine. If there is no Tbuf structure, the MAIN program immediately executes the second phase PARTITION subroutine, described below.

The CREATE_TBUFS_CELL subroutine assigns all of the elements making up the Tbuf structure to a single cell. Elements making up the Tbuf structure may include only the Tbufs which drive a common bus line. Alternatively, in addition to assigning the Tbufs which drive a bus to a cell, the elements which drive the Tbufs are also assigned to the cell. The CREATE_TBUFS_CELL subroutine then returns to the MAIN program.

The MAIN program then executes the PARTITION subroutine and begins a first phase of partitioning. Note that the first phase of partitioning is not executed if there is no Tbuf structure.

The first phase PARTITION subroutine begins by setting the direction of the partitioning cut to vertical. The PARTITION subroutine then analyzes the primary group containing the cell and all elements to determine if the group is too large to fit into a single CLB or IOB. This analysis usually succeeds during partitioning of the primary group because the cell is commonly composed of several elements of the logic design.

Next, the cut direction and any constraints on cut direction for the primary group are compared to determine if the primary group may be partitioned using the current cut direction, in this instance vertical. Note that this test always succeeds during the first phase of partitioning because cut constraints do not exist prior to execution of the DECOMPOSE/LIMIT_TBUF_CELL subroutine. Therefore, the primary group is partitioned using the PROPAGATION and SELECT_PARTITION subroutines.

The PROPAGATION subroutine is essentially the Dunlop and Kernighan "terminal propagation" modified min-cut algorithm, discussed in the Background section. The PROPAGATION subroutine calls the CREATE_DUMMY_ELEMENT subroutine as described in the discussion of terminal propagation.

The SELECT_PARTITION and the TRY_PARTITION subroutines are essentially the basic min-cut algorithm which is described in the Background section. One modification to the SELECT_PARTITION subroutine which is specific to FPGAs is that the elements associated specifically with IOBs are always assigned to the "outermost" sub-group resulting from a partitioning cut. The "outermost" sub-group is the sub-group resulting from the partitioning of a group which is closest to the highest or lowest X- or Y-range value. This assures that the IOB-associated elements are placed into X- and Y-ranges which correspond to the physical position of the IOBs.

After the primary group containing the elements and the cell is partitioned into two smaller groups, the PARTITION subroutine changes the cut direction and partitions each of the two newly formed groups. This process of changing the cut direction and then partitioning all groups continues for each successively smaller group until the cell is isolated in its own group. At this point the first phase of partitioning ends and the pseudocode returns to the MAIN program.

The MAIN program next calls the DECOMPOSE/LIMIT_TBUFS_CELL subroutine. This subroutine replaces the contents of the group containing the cell with the source elements making up the cell. The X-range of the group is then expanded to include the entire horizontal row bounded by the Y-range of the group. In addition, a constraint is placed on the group which limits the cut direction applied to the group to vertical partition lines only.

The PARTITION subroutine is then executed for a second time. This second phase of partitioning is executed in the same manner as in the first phase of partitioning, with the following exception. Before each group which is too large to fit within one CLB or IOB is subjected to the PROPAGATION subroutine, it is checked for cut direction constraints. Since the group containing the source elements from the cell is now restricted to vertical partitioning cuts, every time the cut direction is horizontal, the group is not partitioned. That is, if the cut direction is vertical, then the group is subjected to the PROPAGATION and SELECT_PARTITION subroutines. However, if the cut direction is horizontal, the group is not subjected to any partitioning.

Eventually, all of the groups of elements and the group containing the source elements are partitioned into groups which will fit within one CLB and IOB. At this time the program ends.

The pseudocode will now be further explained using the three-state buffer problem, described above.

4. Application of Pseudocode to Three-state Bus Problem

The pseudocode of Appendix I is further explained by solving the Tbuf problem presented above. The problem will be solved in two examples: first, assuming the initial partitioning cut is vertical; and second, assuming the initial vertical cut is horizontal.

Several assumptions are made in order to clarify the examples. First, it is assumed that each of the elements E1–E4 fill one CLB. Second, no IOB elements are considered. Third, the FPGA section into which the elements are to be partitioned and placed comprises sixteen CLBs arranged in four rows and four columns. Fourth, it is assumed that the Tbuf structure comprises four Tbufs connected to a single line. No other elements providing input or control signals are included, and the input and output nets connected to the Tbuf structure are disregarded. Fifth, explanation of specific partitioning subroutines, such as PROPAGATION and SELECT_PARTITION are omitted. Finally, it is assumed that the X-range expansion of the group containing Tbufs is four CLBs wide.

Figure 9A:
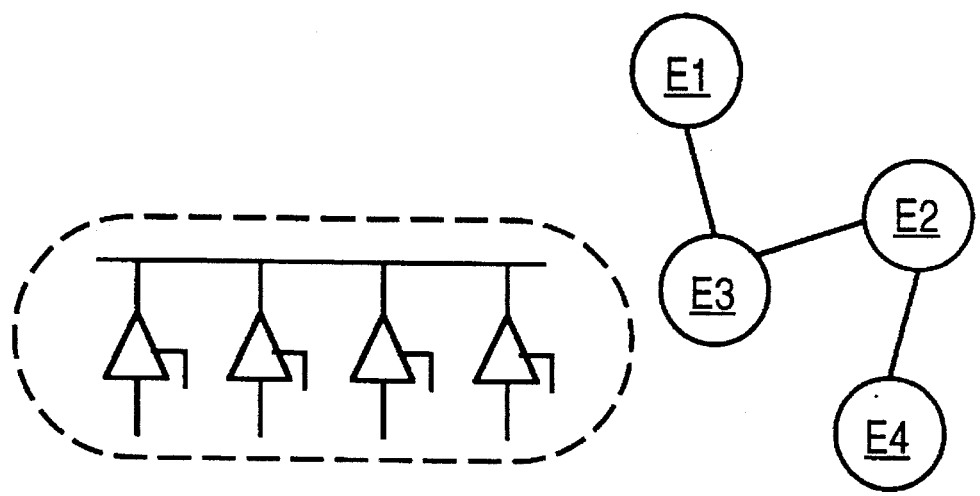
FIGS. 9a–9c illustrate identification of Tbuf elements and forming a cell according to the present invention.

As with the Tbuf problem described above, the elements to be partitioned are four Tbufs and four elements E1–E4 (refer to FIG. 9a). The dashed line surrounding the four Tbufs indicates the Tbuf structure which is recognized by the pseudocode and which will be formed into a cell.

Figure 9B:
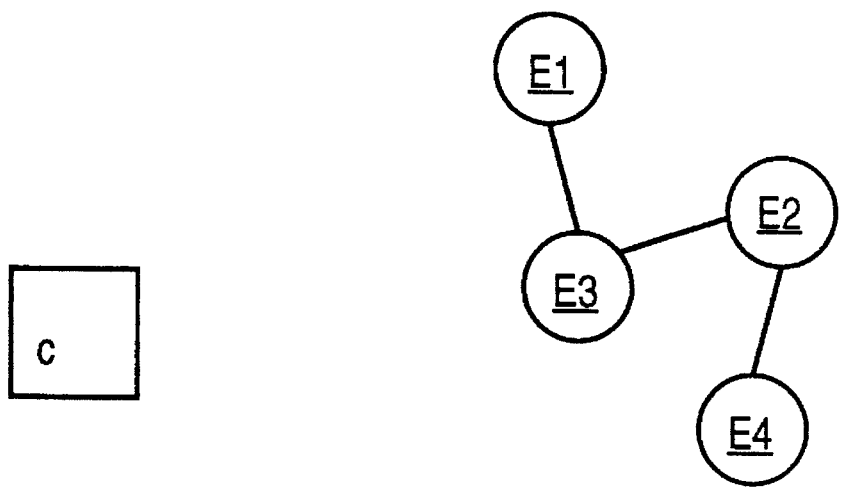

The MAIN program calls the CREATE_TBUF_CELL subroutine upon detection of the Tbuf structure. The CREATE_TBUF_CELL subroutine then assigns the four Tbufs to the cell C (shown in FIG. 9b). The pseudocode then returns control to the MAIN program, which then executes the first phase of partitioning. The following two examples will describe the first and second phases of partitioning after the creation of the cell C.

Figure 9C:
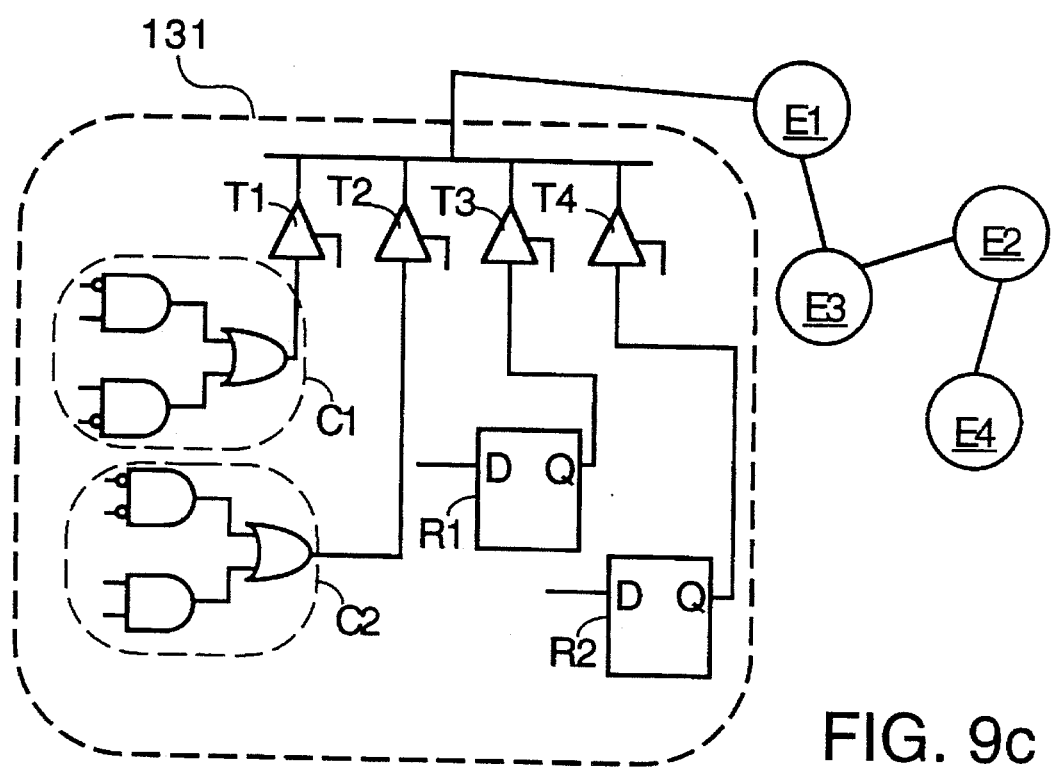

Alternatively, as shown in FIG. 9c, both the Tbufs and the elements which drive them are formed into a cell, which is handled as a unit during the first phase of partitioning. In the example of FIG. 9c, Tbuf T1 and its driving element C1, Tbuf T2 and its driving element C2, Tbuf T3 and its driving element register R1, and Tbuf T4 and its driving element register R4 are all grouped into cell 131. The bus driven by Tbufs T1 through T4 drives element El, which need not be on the same horizontal line as the bus and is not grouped into the cell. (This further grouping tends to improve final placement and produce improved timing performance of the routed design.)

First Embodiment Example One: Vertical Initial Partitioning Cut

Example One assumes that the first partitioning cut direction is vertical. In addition this example assumes that the cell is separated from elements E1–E4 by the initial vertical partitioning cut. It should be recognized that the min-cut algorithm may be modified, as discussed above, to partition the group into equal or nearly equal portions, or the min-cut algorithm may partition the group such that a substantial balance in the number of elements in each sub-group is created. The latter modification is assumed in this example.

Figure 10A:
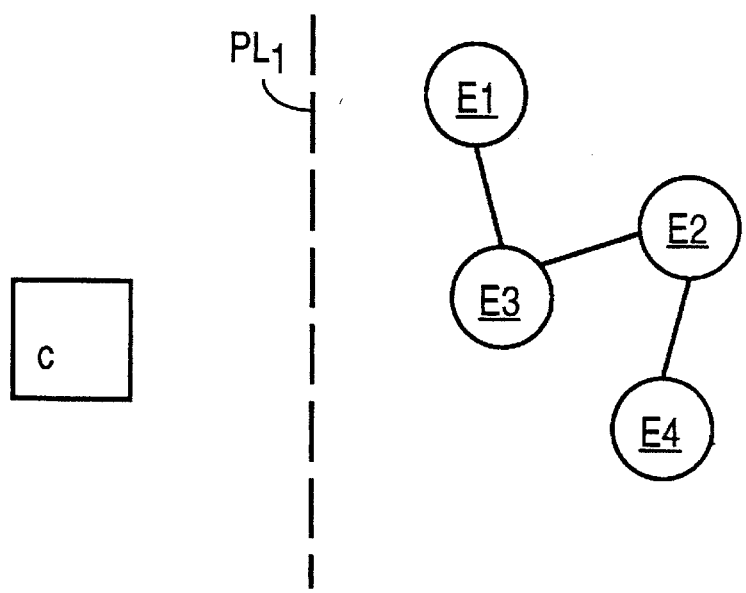
FIGS. 10a–10g illustrate a first example showing how the present invention solves the Tbuf problem.

FIGS. 10a–10f illustrate the partitioning of the cell and elements E1–E4 during this example. During first phase partitioning using the PARTITION subroutine, the cell is separated by partition line PL1 into the left sub-group as shown in FIG. 10a. Likewise, the elements are partitioned into the right sub-group. After this partitioning cut, the cell is isolated from all other elements of the circuit design. Therefore, the condition set for the end of the first phase of partitioning is satisfied.

Figure 10B:
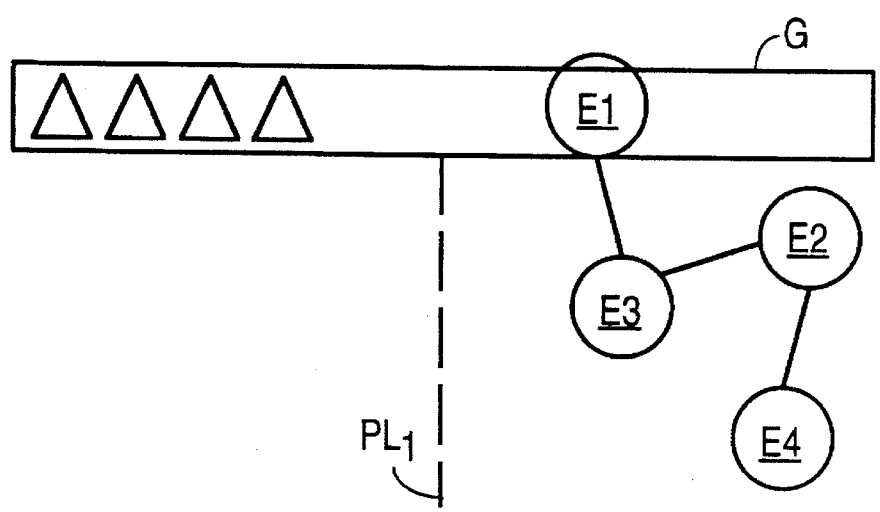
Figure 10C:
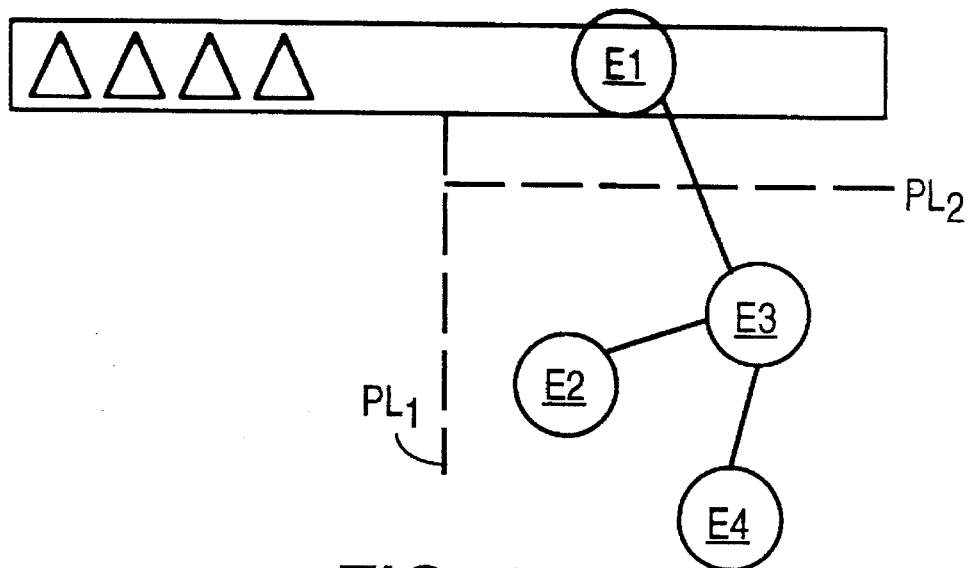

Next, the MAIN program calls the DECOMPOSE/ LIMIT_TBUF_CELL subroutine. This subroutine decomposes the cell into the "source elements", or the four Tbufs, while retaining the four Tbufs in one group (FIG. 10b). The X-range and Y-range of the group are then adjusted to correspond to the entire upper row of four Tbufs connected to the upper row of four CLBs. Note that the X-range of the group of Tbufs overlaps the group containing elements E1–E4. As explained above, this overlap is not addressed by the modified partitioning method of the present invention. Finally, a constraint is placed on the group that its elements are only to be partitioned using vertical partition lines.

Next, second phase partitioning is called by the MAIN program. Because the previous partitioning cut direction was vertical, the partitioning cut direction is changed to horizontal. Each of the two groups is tested for cut direction constraints. The group containing elements E1–E4 has no cut direction constraints, and is partitioned as indicated by line PL2 in FIG. 10c. However, group containing the Tbufs is limited to vertical partitioning only. Therefore, the Tbuf group is not partitioned by a horizontal partitioning line.

Figure 10D:
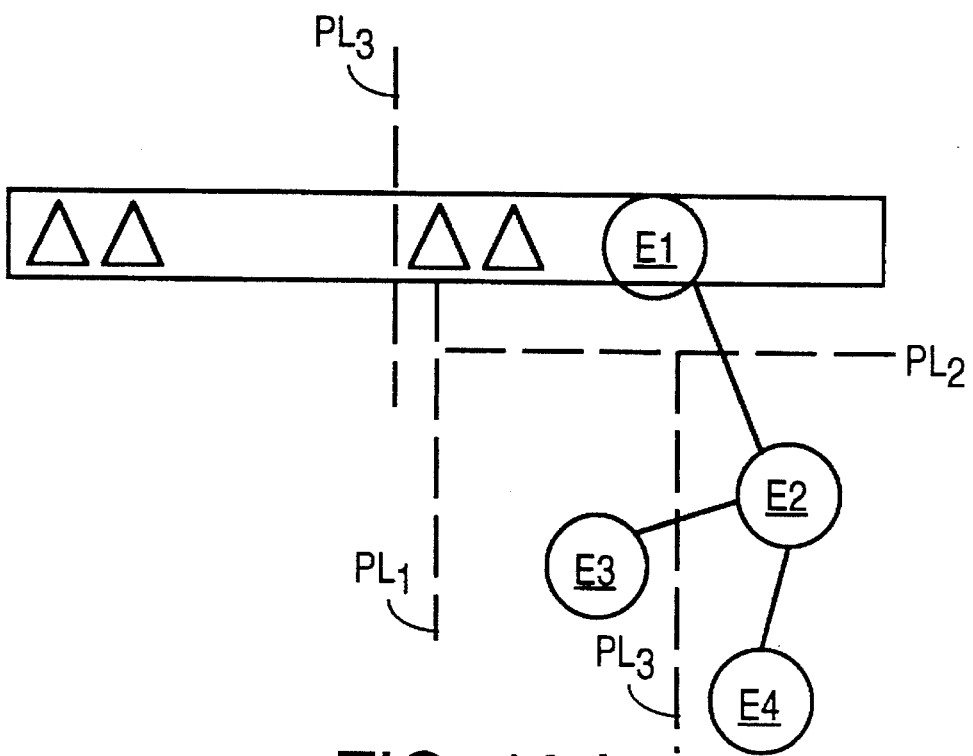

The PARTITION subroutine next changes the cut direction to vertical. Because the "group" containing element E1 fits within one CLB, the "group" is not further partitioned. The groups containing elements E2–E4 and the four Tbufs are partitioned with partition lines PL3, as shown in FIG. 10d.

Figure 10E:
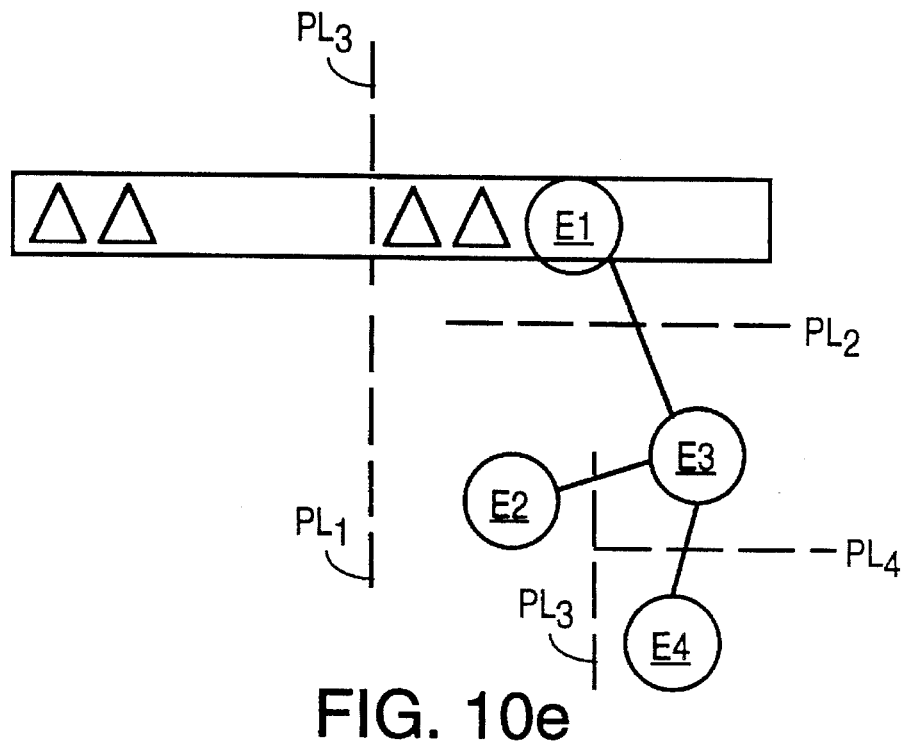

The PARTITION subroutine then changes the cut direction to horizontal. Because the "group" containing element E2 fits within one CLB, the "group" is not further partitioned. The group containing elements E3 and E4 is partitioned with partition lines PL4, as shown in FIG. 10e. Note that because the partition line is horizontal, neither of the sub-groups containing Tbufs is partitioned.

Figure 10F:
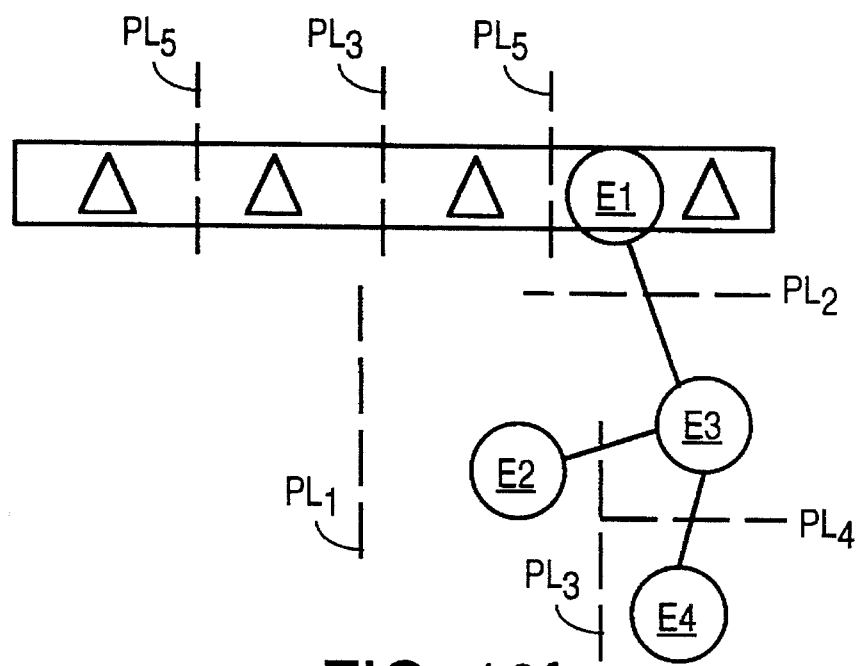

Finally, the PARTITION subroutine changes the cut direction to vertical for the last partition cut. Because all of the "groups" containing elements fit within one CLB, the "groups" are not further partitioned. The sub-groups containing Tbufs are each partitioned by partition lines PL5 as shown in FIG. 10f. At the end of this partition all "groups" fit within one CLB, and therefore the program ends.

Figure 10G:
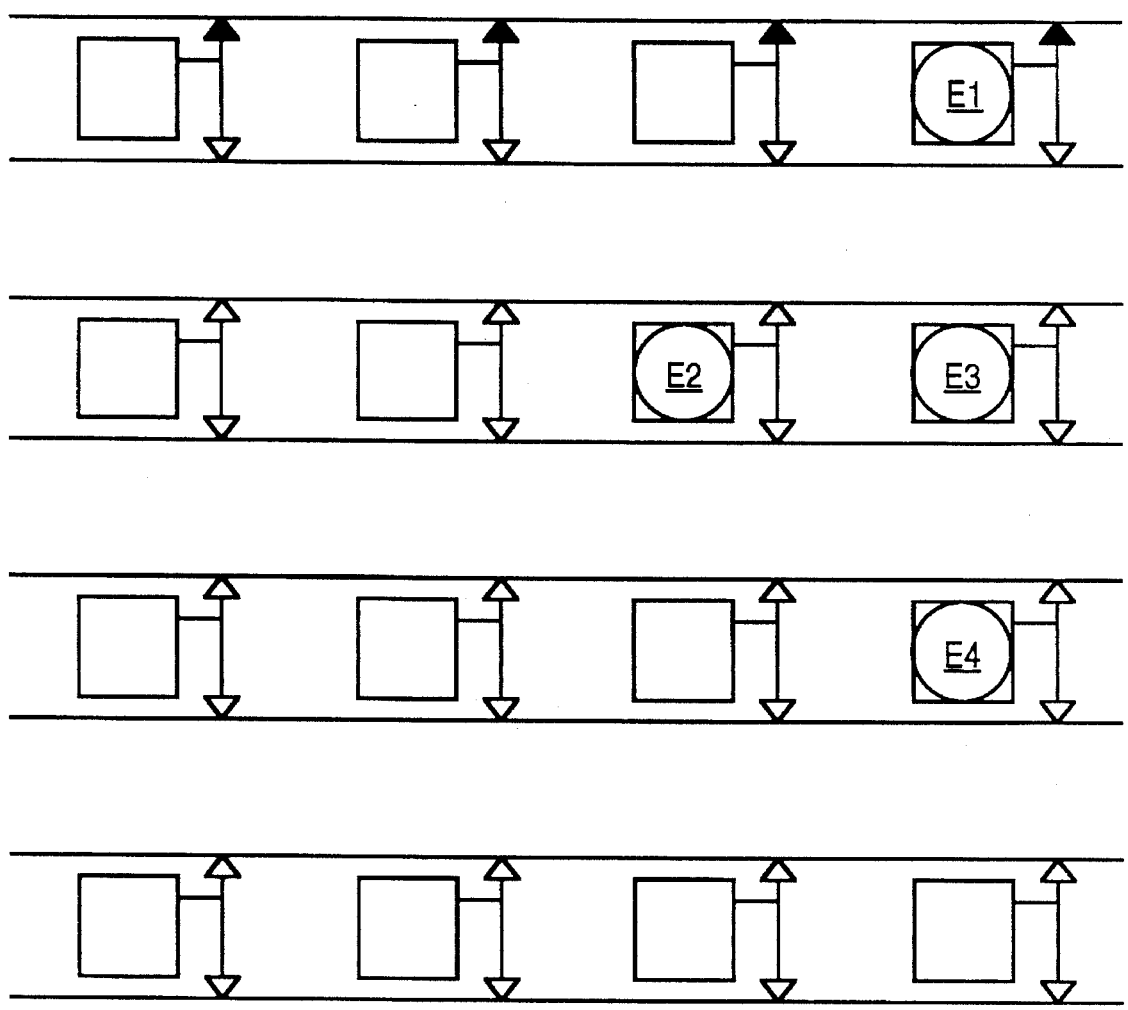

The "rough" placement of the Tbufs and elements into the 4×4 CLB matrix, and as determined by the modified partitioning method described above, is shown in FIG. 10g. In FIG. 10g, the placement of elements E1–E4 are indicated by superimposing the element on the associated CLB. The placement of Tbufs is indicated by the row of darkened Tbuf elements.

First Embodiment Example Two; Vertical Initial Partitioning Cut

Example Two assumes that the first partitioning cut direction is horizontal. In addition this example assumes that the cell is grouped with element E4 as a result of the initial horizontal partitioning cut.

Figure 11A:
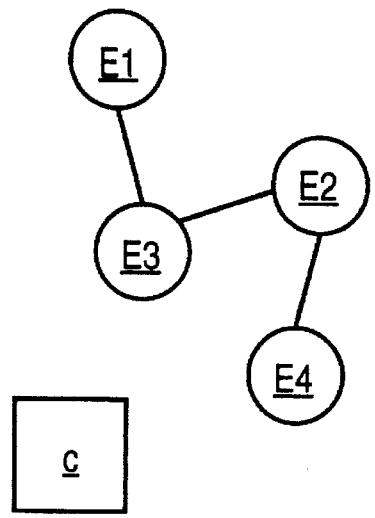
FIGS. 11a–11g illustrate a second example showing how the present invention solves the Tbuf problem.

FIGS. 11a–11f illustrate the partitioning of the cell and elements E1–E4 during this example. During first phase partitioning using the PARTITION subroutine, it is assumed that the cell and element E4 are partitioned by partition line PL1 into the lower sub-group as shown in FIG. 11a. Likewise, the elements E1–E3 are partitioned into the upper sub-group.

Figure 11B:
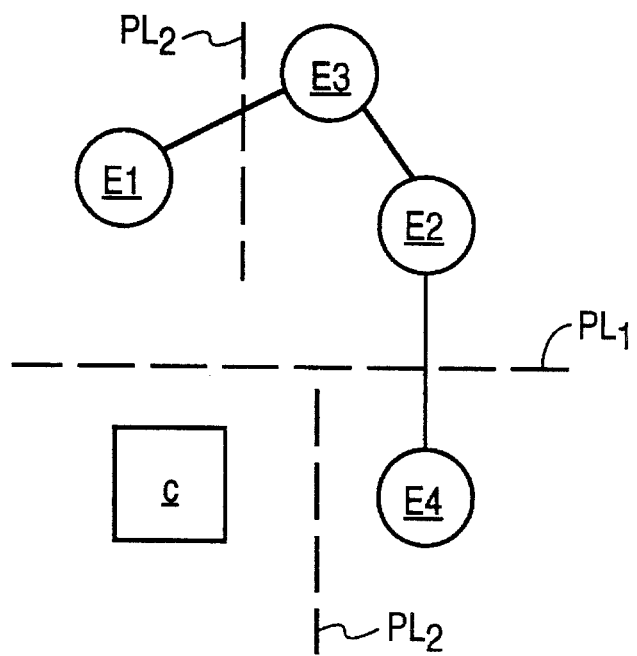

Because the cell is not isolated, the PARTITION subroutine would then change the partition cut direction to vertical and apply the partitioning cut to the two groups. One possible result of a vertical cut is indicated by partition lines PL2, as shown in FIG. 11b. After this partitioning cut, the cell is isolated from all other elements of the circuit design. Therefore, the condition set for the end of the first phase of partitioning is satisfied.

Figure 11C:
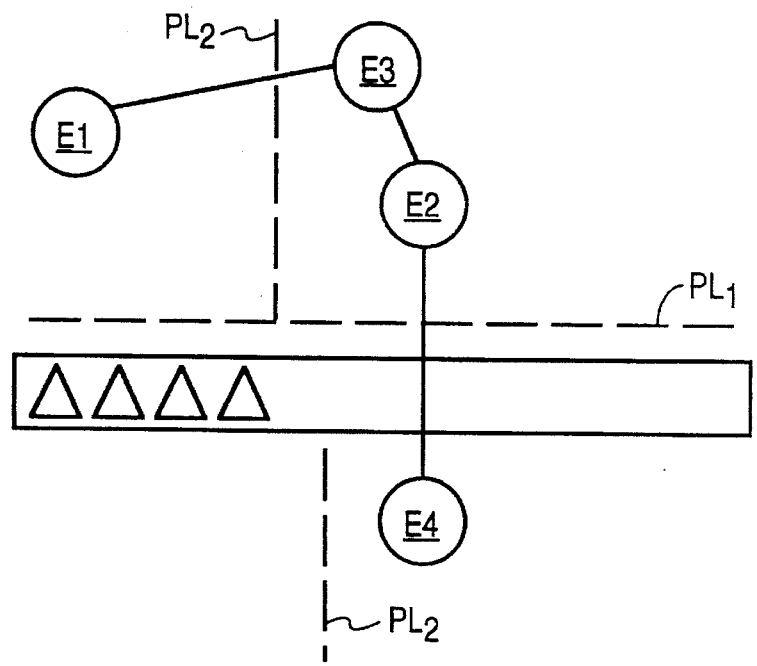
Figure 11D:
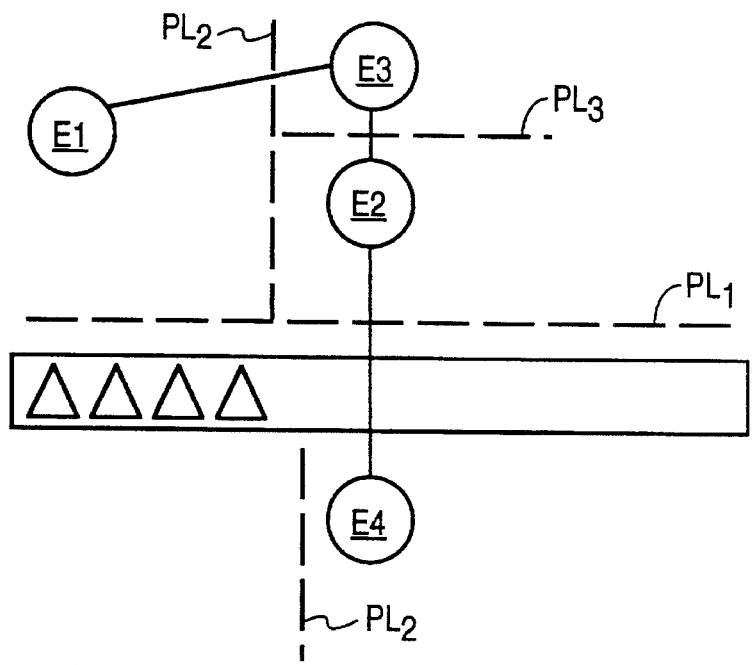

Next, the MAIN program calls the DECOMPOSE/ LIMIT_TBUF_CELL subroutine. This subroutine decomposes the cell into the four Tbufs, while retaining the four Tbufs in one group (FIG. 11c). The X-range and Y-range of the group are then adjusted to correspond to the entire upper row of four Tbufs connected to the lower-middle row of four CLBs. Note that the X-range of the group of Tbufs does not overlap any the groups containing elements E1–E4 in this example. Finally, a constraint is placed on the group that its elements are to be partitioned using only vertical partition lines.

Next, second phase partitioning is called by the MAIN program. Because the previous partitioning cut direction was vertical, the partitioning cut direction is changed to horizontal. Also, because the "groups" containing elements E1 and E4 fit within one CLB, the "groups" are not further partitioned. Each of the remaining groups is tested for cut direction constraints. The group containing elements E2 and E3 has no cut direction constraints, and is partitioned as indicated by line PL3 in FIG. 11d. However, the group containing the Tbufs is limited to vertical partitioning only. Therefore, the Tbuf group is not partitioned by a horizontal partitioning line.

Figure 11E:
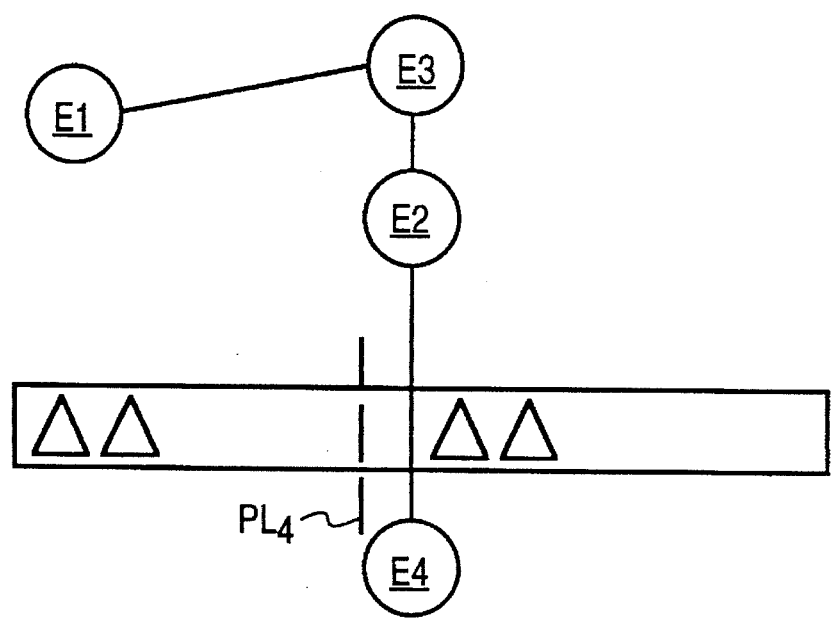

The PARTITION subroutine next changes the cut direction to vertical. Because the "groups" containing element E2 and E3 fit within one CLB, the "groups" are not further partitioned. The group containing the four Tbufs is partitioned with partition line PL4, as shown in FIG. 11e.

The PARTITION subroutine then changes the cut direction to horizontal. Because no group of elements is to be partitioned, and because of the cut direction constraints on the group containing the Tbufs, no further partitioning is done in the horizontal direction.

Figure 11F:
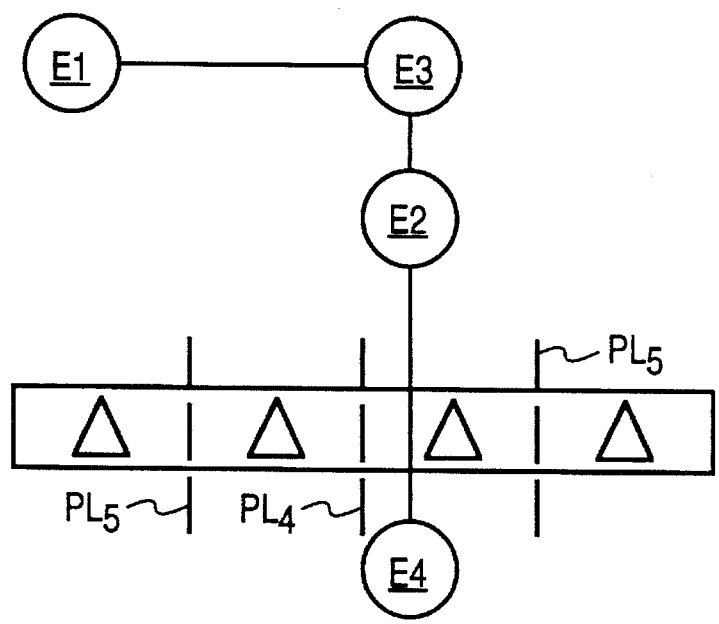

Finally, the PARTITION subroutine changes the cut direction to vertical for the last partition cut. The subgroups containing Tbufs are each partitioned by partition lines PL5 as shown in FIG. 11f. At the end of this partition all "groups" fit within one CLB, and therefore the program ends.

Figure 11G:
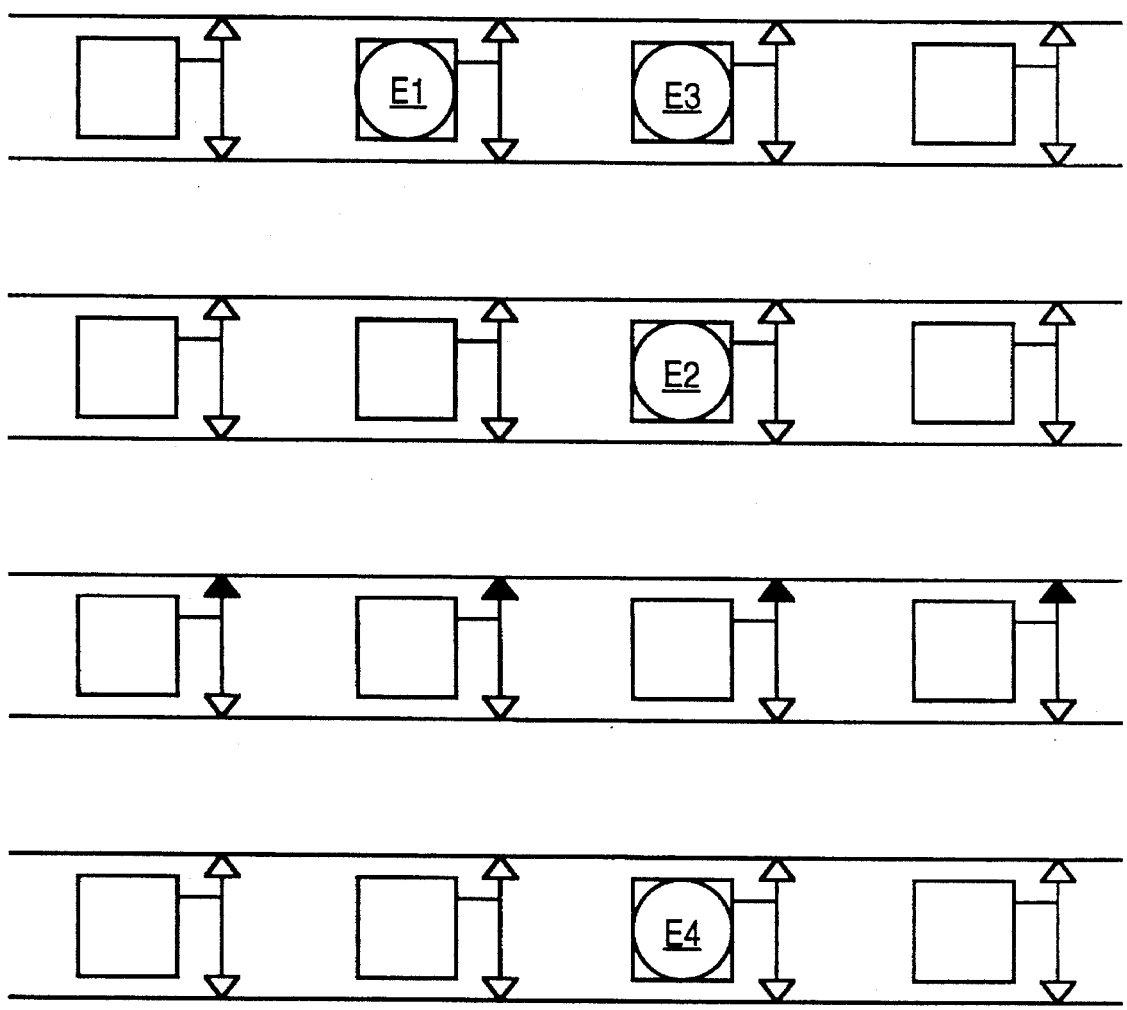

The "rough" placement of the Tbufs and elements into the 4×4 CLB matrix, and as determined by the modified partitioning method described above, is shown in FIG. 11g. In FIG. 11g, the placement of elements E1–E4 are indicated by superimposing the element on the associated CLB. The placement of Tbufs is indicated by the row of darkened Tbuf elements.

In light of the above description, other embodiments of the present invention will become obvious to those skilled in the art. Such other embodiments are intended to fall within the scope of the present invention.

APPENDIX I

MAIN program:

If the circuit design contains a Tbuf structure,

CREATE_TBUF_CELL (see subroutine below, which groups into a single cell all elements associated with the Tbuf structure.)

Do  PARTITION (see subroutine below, which draws successive partitioning lines through the elements of the circuit design, alternating the current cut direction between horizontal and vertical)
        until the cell is isolated from all other groups of elements.

DECOMPOSE/LIMIT_TBUF_CELL (see subroutine below for decomposing the cell into a group containing the cell's source elements)
    End if.

Do  PARTITION (see subroutine below for drawing successive partitioning lines through the remaining groups of elements, alternating the current cut direction between horizontal and vertical, and through the group containing the source elements of the cell, only in the vertical direction)
    until all groups fit within one CLB or IOB.

PARTITION subroutine:

If current cut direction is vertical, then change current cut direction to horizontal,
    Else change current cut direction to vertical;

For each group which will not fit one CLB or IOB:

If the cut direction allowed by the DECOMPOSE/LIMIT_TBUF_CELL subroutine is same as current partitioning cut direction Do  PROPAGATION (see subroutine below for counting the number of nets which cross a

```
                            previous  partitioning  line)

Do  SELECT_PARTITION (see subroutine below for
                    optimizing the division of elements and cells into two
                    groups)
        End if.
    End for.

PROPAGATION subroutine:

For each element in the group;

For each net of the element;

If the net connects to an element which is in a
                different group then store the net.
        End for.
    End for.

For each stored net:

CREATE_DUMMY_ELEMENT (see subroutine below for
                placing a dummy element at the edge of the group
                closest to the actual location of the element in an
                adjacent group to which the net connects)
    End for.

CREATE_DUMMY_ELEMENT subroutine:

If current cut direction is horizontal:

If outside group is above inside group, create dummy
        element at the top of the group Else create dummy element at the bottom of the group
    Else
        If outside group is on the right of inside group, create
        dummy element at the right of the group Else create dummy element at the left of the group.
```

SELECT_PARTITION subroutine:

Divide group into two sub-groups, assigning input/output
    elements to IOBs at boundaries of chip For each net crossing the partition line, compute number of
    elements on each side of the partition line contacted by the net.

Count number of nets crossing the partition line, for comparing
    gain of an intermediate step.

Reduce number of cut nets as much as possible:
        Do:
            TRY_PARTITION (see subroutine below for evaluating
            partitioning lines)

Determine the step having the largest reduction in
            nets crossing the partition line.

Undo moves after the step having the largest
            reduction.

While the best total gain is positive.

TRY_PARTITION subroutine:

Mark all elements in group being partitioned as unmoved.

Do:
        Move the element having the most nets crossing the sub-
        partition line, Compute the gain in nets crossing the sub-partition line, Mark the element as moved, Until all elements have been moved.

CREATE_TBUF_CELL subroutine:

Create a cell containing all the elements of the Tbuf structure;

```
1   DECOMPOSE/LIMIT_TBUF_CELL subroutine:
2
3       Decompose cell into source elements such that the group
4       containing the cell becomes a group containing the source
5       elements,
6
7       Change X-range of group to X-lo = 0 and X-hi = 1,
8
9       If Y-range includes more than one horizontal long line, then
10      change Y-range to encompass the horizontal long line closest to
11      Y-hi,
12
13      Limit cut direction for partition lines dividing the group
14      containing the source elements to vertical;
15
16
```

We claim:

1. A partitioning method for placing a circuit design into a programmable integrated circuit device having a distribution of physical resources along a horizontal or vertical line, the circuit design comprising a plurality of circuit elements, some of which are to be distributed to said physical resources along a horizontal or vertical line, the method comprising:

identifying specific circuit elements of the plurality of circuit elements to be placed along a horizontal or vertical line;

attaching weights to lines connected to said circuit elements identified as elements to be placed along a horizontal or vertical line, said weights related to the disadvantage of placing said elements on opposite sides of a cut line parallel to said horizontal or vertical line; and partitioning the plurality of circuit elements according to a min-cut procedure such that a cost of crossing said cut line is determined using those of said weights which are attached to lines crossing said cut line.

2. A partitioning method as in claim 1 in which said programable integrated circuit device is field programmable.

3. A partitioning method as in claim 1 in which said programmable integrated circuit device is mask programmable.

4. A partitioning method as in claim 3 in which said programmable integrated circuit device is formed from at least two metal layers, one of which is manufactured before said partitioning method is used, and one of which is manufactured after said partitioning method is used.

5. A partitioning method for placing a circuit design into a programmable integrated circuit device having a distribution of physical resources along a horizontal line, the circuit design comprising a plurality of circuit elements, some of which are to be distributed to said physical resources along a horizontal line, the method comprising:

identifying specific circuit elements of the plurality of circuit elements to be placed along a horizontal line;

attaching constraints to lines connected to said circuit elements identified as elements to be placed along a horizontal line, said constraints identifying elements to be moved if the horizontal line is moved; and partitioning the plurality of circuit elements according to a min-cut procedure such that when a member of a marked group is moved across a horizontal cut line, other members of the group are also moved across the horizontal cut line.

6. A partitioning method for placing a circuit design into a programmable integrated circuit device having a plurality of types of physical resources distributed along horizontal or vertical lines, the circuit design comprising a plurality of circuit elements, the method comprising the following steps:

identifying and assigning to single cells those elements of said plurality of circuit elements associated with one of said plurality of types of physical resources;

partitioning said circuit design during a first phase until all of said single cells are in their own groups and all of said circuit elements which are not part of said single cells are in their own groups;

decomposing said single cells into source circuit elements from which they were composed and marking said source circuit elements to indicate a type of said plurality of types of physical resources with which they are associated;

adjusting X ranges and Y ranges of said source circuit elements to reflect alignments of said types of physical resources with which said source circuit elements are associated; and partitioning said circuit design during a second phase, wherein partitioning of said source circuit elements is restricted according to said alignments of said types of physical resources with which they are associated.

7. A partitioning method as in claim 6 wherein said step of identifying and assigning includes assigning to said single cells those elements of said plurality of circuit elements not associated with one of said plurality of types of physical resources.

8. A partitioning method as claim 6 in which said programmable integrated circuit device is field programmable.

9. A partitioning method as in claim 6 in which said programmable circuit device is mask programmable.

10. A partitioning method as in claim 9 in which said programmable integrated circuit device is formed from at least two metal layers, one of which is manufactured before said partitioning method is used, and one of which is manufactured after said partitioning method is used.

* * * * *